(12) United States Patent
Tantawy

(10) Patent No.: US 11,570,392 B2
(45) Date of Patent: Jan. 31, 2023

(54) SCALABLE READOUT INTEGRATED CIRCUIT ARCHITECTURE WITH PER-PIXEL AUTOMATIC PROGRAMMABLE GAIN FOR HIGH DYNAMIC RANGE IMAGING

(71) Applicant: SENSEICS CORPORATION, Columbus, OH (US)

(72) Inventor: Ramy Tantawy, Columbus, OH (US)

(73) Assignee: Senseics Corporation, Columbus, OH (US)

( * ) Notice: Subject to any disclaimer, the term of this patent is extended or adjusted under 35 U.S.C. 154(b) by 139 days.

(21) Appl. No.: 16/887,983

(22) Filed: May 29, 2020

(65) Prior Publication Data

US 2021/0037201 A1 Feb. 4, 2021

Related U.S. Application Data

(60) Provisional application No. 62/880,255, filed on Jul. 30, 2019.

(51) Int. Cl.
*H04N 5/3745* (2011.01)
*H04N 5/378* (2011.01)

(52) U.S. Cl.
CPC ......... *H04N 5/378* (2013.01); *H04N 5/37455* (2013.01); *H04N 5/37457* (2013.01)

(58) Field of Classification Search
None
See application file for complete search history.

(56) References Cited

U.S. PATENT DOCUMENTS

2013/0259471 A1* 10/2013 Wang ............... H04B 10/07955
398/38
2017/0033867 A1* 2/2017 Robinson ......... H04B 10/07955

OTHER PUBLICATIONS

Kenneth I Schultz et al., "Digital-Pixel Focal Plane Array Technology," Lincoln Laboratory Journal 20, No. 2 (2014): 36-51.
C. -C. Liu, S. -J. Chang, G. -Y. Huang, and Y. -Z. Lin, "A 10-bit 50-MS/s SAR ADC With a Monotonic Capacitor Switching Procedure," IEEE Journal of Solid-State Circuits, vol. 45, No. 4, pp. 731-740, 2010.
B. Murmann, "ADC Performance Survey 1997-2012," [Online]. Available: http://www.stanford.edu/~murmann/adcsurvey.html.

* cited by examiner

*Primary Examiner* — Mark T Monk
(74) *Attorney, Agent, or Firm* — Eschweiler & Potashnik, LLC

(57) ABSTRACT

An imager device includes a pixel sensor configured to receive and convert incident radiation into a pixel signal and a readout circuit configured to receive the pixel signal from the pixel sensor, generate a received signal strength indicator (RSSI) value based on the pixel signal, and generate a digital signal based on the RSSI value and the pixel signal.

20 Claims, 14 Drawing Sheets

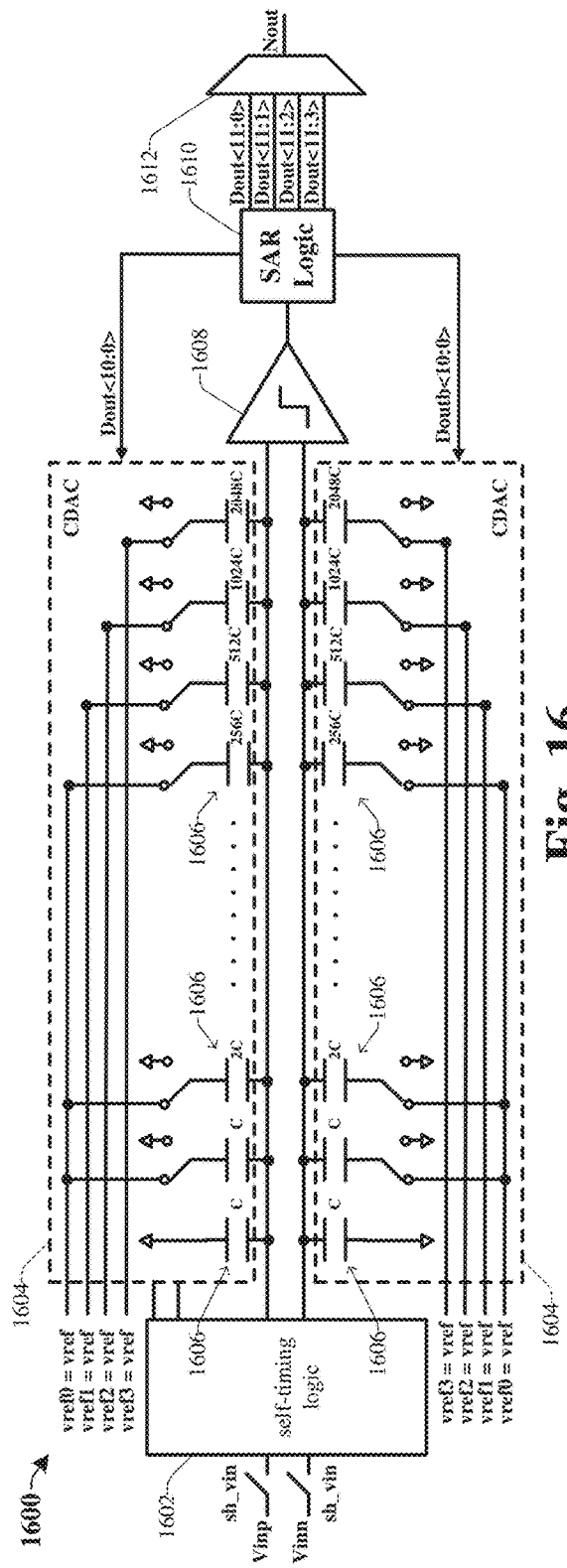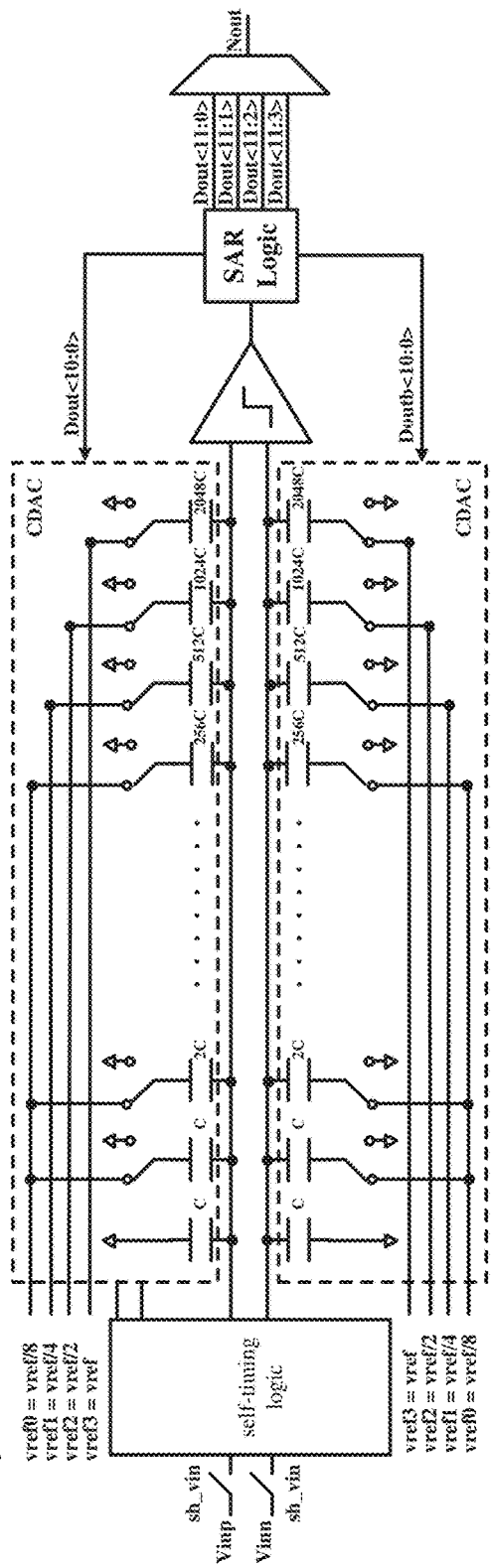
Fig. 16
Fig. 17

US 11,570,392 B2

SCALABLE READOUT INTEGRATED CIRCUIT ARCHITECTURE WITH PER-PIXEL AUTOMATIC PROGRAMMABLE GAIN FOR HIGH DYNAMIC RANGE IMAGING

REFERENCE TO RELATED APPLICATION

This application claims the benefit of U.S. Provisional Application No. 62/880,255 filed Jul. 30, 2019, entitled "SCALABLE READOUT INTEGRATED CIRCUIT ARCHITECTURE WITH PER-PIXEL AUTOMATIC PROGRAMMABLE GAIN FOR HIGH DYNAMIC RANGE IMAGING", the contents of which are herein incorporated by reference in their entirety.

FEDERAL FUNDING NOTICE

This invention was made with Government support under contract number W911QX18P0075 awarded by US ARMY/ARMY RESEARCH LABORATORY (ARL). The Government has certain rights in the invention.

FIELD

The present disclosure is directed to a read out integrated circuit (ROIC) with a reconfigurable readout using a per-pixel gain selection to allow on-the-fly adaptations to wide dynamic range scenes using a column-parallel analog to digital converter (ADC) readout architecture.

BACKGROUND

Many electronic devices (e.g., cell phones, digital cameras, imaging devices, etc.) include image sensors. The image sensors convert incident electromagnetic radiation to electrical signals that may be represented as digital images. An image sensor may include an array of pixel sensors which each convert incident electromagnetic radiation into electrical signals that may be output into a ROIC for digital signal processing. The ROIC may convert the electrical signals from the array of pixel sensors into the digital images.

BRIEF DESCRIPTION OF THE DRAWINGS

FIGS. 16 and 17 illustrate block diagrams of some alternative embodiments of a reconfigurable ADC utilized in a ROIC architecture that is configured to set a gain for each pixel sensor in a pixel array according to corresponding RSSI bits.

DETAILED DESCRIPTION

Figure 1A:
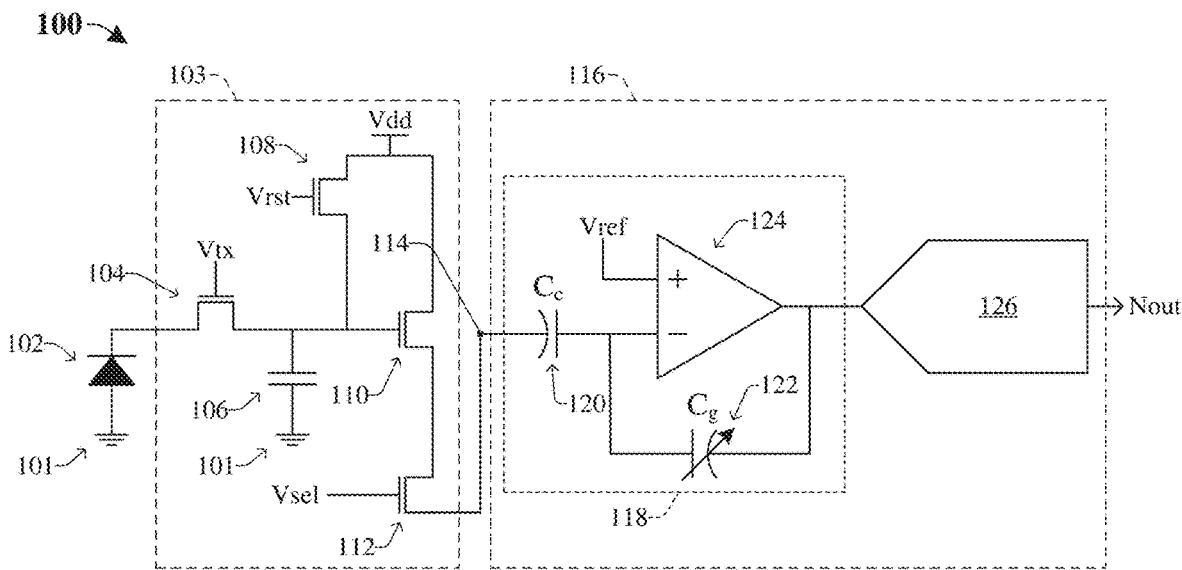
FIGS. 1A-D illustrate various diagrams of some embodiments of a readout architecture that is configured to adjust the gain of a pixel sensor to a fixed value.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

To reduce power consumption in a read out integrated circuit (ROIC) for image sensing devices, various embodiments provide a reconfigurable ROIC using a per-pixel gain selection to allow on-the-fly adaptations to wide dynamic range scenes. The ROIC may be customized to target specific applications and may be fabricated on a three-dimensional integrated circuit (3DIC). The ROIC utilizes received signal strength indicator (RSSI) bits to maximize the utilization of the full-scale photo-diode (PD) dynamic range at both low and high signal levels.

FIG. 1A illustrates a block diagram of some embodiments of a readout architecture 100 that is configured to adjust the gain of a pixel sensor 102. The pixel sensor 102 is configured to absorb electromagnetic radiation (e.g., photons) and generate electrical signals corresponding to the electromagnetic radiation. The pixel sensor 102 is electrically coupled to a front-end readout circuit 103 that comprises a plurality of pixel devices 104-112 configured to facilitate readout of the generated electrical signals to a column input node 114. For example, during operation of the circuit 100, the pixel sensor 102 is directly electrically coupled to a first source/drain region of a transfer transistor 104 and a ground node 101. Through application of a suitable transfer voltage Vtx to a gate electrode of the transfer transistor 104, charge accumulated within the pixel sensor 102 may be transferred to a first source/drain region of a reset transistor 108 and a gate electrode of a source follower transistor 110. The gate electrode of the source follower transistor 110 has a capacitance (e.g., as illustrated by the storage capacitor 106) for integration of the electrical signal provided by the pixel sensor 102. If the charge level at the gate electrode of the source follower transistor 110 is sufficiently high, the source follower transistor 110 is activated and an electrical signal is selectively output according to operation of a select transistor 112 used for addressing. A second source/drain region of the reset transistor 108 and a first source/drain region of the source follower transistor 110 are electrically coupled to a power supply (e.g., a DC power supply) configured to supply a voltage Vdd. Between exposure periods of the electromagnetic radiation, a reset voltage Vrst may be applied to a gate electrode of the reset transistor 108 to reset the storage capacitor 106 and/or the pixel sensor 102 to an initial voltage (e.g., 5 volts). Subsequently, a select voltage Vsel may be applied to a gate electrode of the select transistor 112 to transfer the generated electrical signal to the column input node 114.

Further, the generated electrical signal at the column input node 114 is input into a readout circuit 116. The readout circuit 116 includes a programmable gain amplifier (PGA) 118 and a column analog to digital converter (ADC) 126. It will be appreciated that in some embodiments, the pixel sensor 102 may be part of an array of pixel sensors organized in a plurality of rows and a plurality of columns. In such embodiments, the readout circuit 116 is configured to receive a generated electrical signal from a selected column of pixel sensors in the array. The column input node 114 is electrically coupled to an inverting node of a feedback amplifier 124 by way of a coupling capacitor 120. The coupling capacitor 120 has a capacitance $C_c$. A reference voltage Vref is electrically coupled to a non-inverting node of the feedback amplifier 124. A gain capacitor 122 is electrically coupled between the inverting node of the feedback amplifier 124 and an output of the feedback amplifier 124. The gain capacitor 122 has a capacitance $C_g$ such that a ratio of capacitances between the coupling capacitor 120 and the gain capacitor 122 (e.g., $C_c/C_g$) may determine a gain of the feedback amplifier 124. Thus, a gain value for the generated electrical signal from the pixel sensor 102 may be set by choosing proper capacitance values for the coupling capacitor 120 and the gain capacitor 122. In further embodiments, the gain capacitor 122 may be configured as a variable capacitor, such that the capacitance $C_g$ may be adjusted to achieve a desirable gain value. Thus, the generated electrical signal at the column input node 114 may be amplified by the PGA 118 and subsequently input into the column ADC 126 such that a column output signal Nout may be accessed at an output of the ADC 126.

Figure 1B:
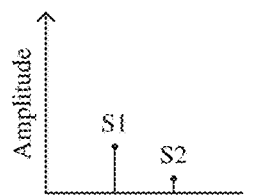
Figure 1C:
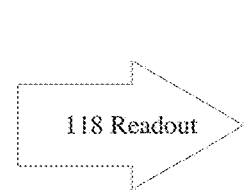
Figure 1C:
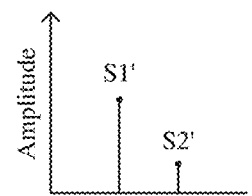

In some embodiments, the PGA 118 is configured to adjust the gain of each pixel sensor in an array to a fixed gain value that is set for each capture period. In such embodiments, the fixed gain value will typically bet set low enough to avoid saturation while capturing the full-well in an attempt to reduce an intra-scene dynamic range of the pixel array. For example, FIG. 1B illustrates some embodiments of a single frame of a first electrical signal S1 generated by a first pixel sensor in the pixel array and a second electrical signal S2 generated by a second pixel sensor in the pixel array. FIG. 1C illustrates some embodiments of the first and second electrical signals S1, S2 of FIG. 1B after being input into the PGA 118, in which each signal is amplified by a fixed gain value (e.g., a fixed gain value of 2) to generate an amplified first electrical signal S1' and an amplified second electrical signal S2'. In such embodiments, the amplified first electrical signal S1' has an amplitude that is two times greater than the first electrical signal S1, and the amplified second electrical signal S2' has an amplitude that is two times greater than the second electrical signal S2. In yet further embodiments, the fixed gain value of the PGA 118 may be large enough to increase a signal-to-noise ratio (SNR) of the amplified second electrical signal S2' to a value great enough for proper detection. However, the fixed gain value may cause the amplified first electrical S1' to reach saturation, thereby negatively impacting performance of the readout circuit 116.

Figure 1D:
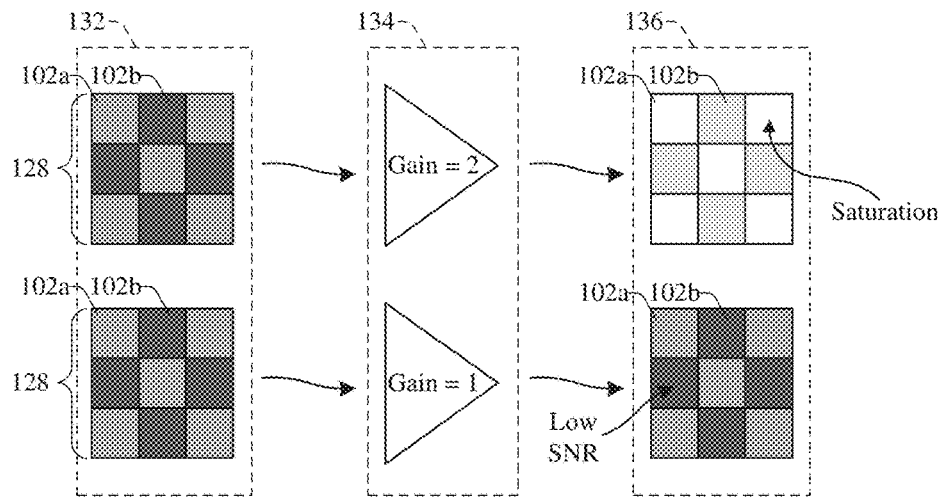

FIG. 1D illustrates a block diagram of some embodiments of a pixel array 128 being input into the PGA 118 at different gain values. Block 132 illustrates a readout of the pixel array 128 before applying a gain value to each pixel sensor. In some embodiments, the pixel array 128 comprises a plurality of pixel sensors arranged in rows and columns. For example, the pixel array 128 comprises a first pixel sensor 102a and a second pixel sensor 102b. Block 134 illustrates various fixed gain values (e.g., a fixed gain value of 1 and 2 for the PGA 118) that may be applied to each pixel sensor in the pixel array 128. Block 136 illustrates various embodiments of the pixel array 128 after applying the fixed gain values of block 134 to each pixel sensor (i.e., inputting the readout of the pixel array 128 through the PGA 118 at the different fixed gain values). For example, when the fixed gain value is 2, then the first pixel sensor 102a may reach saturation after being amplified and the second pixel sensor 102b may have an increased SNR value. In another example, when the fixed gain value is 1, then the first pixel sensor 102a may have a sufficient SNR value, however, a SNR of the second pixel sensor 102b may too low, thereby resulting in an inaccurate output signal. Thus, the fixed gain value of the PGA 118 limits the intra-scene dynamic range of the readout circuit 116. The lack of flexibility to adjust the gain per-pixel forces a fixed gain value to be used by the PGA 118 across the entire pixel array 128. This fixed gain will typically be set low enough to avoid saturation while capturing the full-well in attempt to reduce the intra-scene dynamic range. Moreover, the full-well sets a minimum ADC resolution of the ADC 126 used to achieve the maximum dynamic range. However, a lower ADC resolution will subsequently increase ADC quantization noise and thus reduce the low-signal level sensitivity. Thus, increasing the ADC resolution to meet the sensitivity requirements unnecessarily increases the readout power requirements.

Figure 2A:
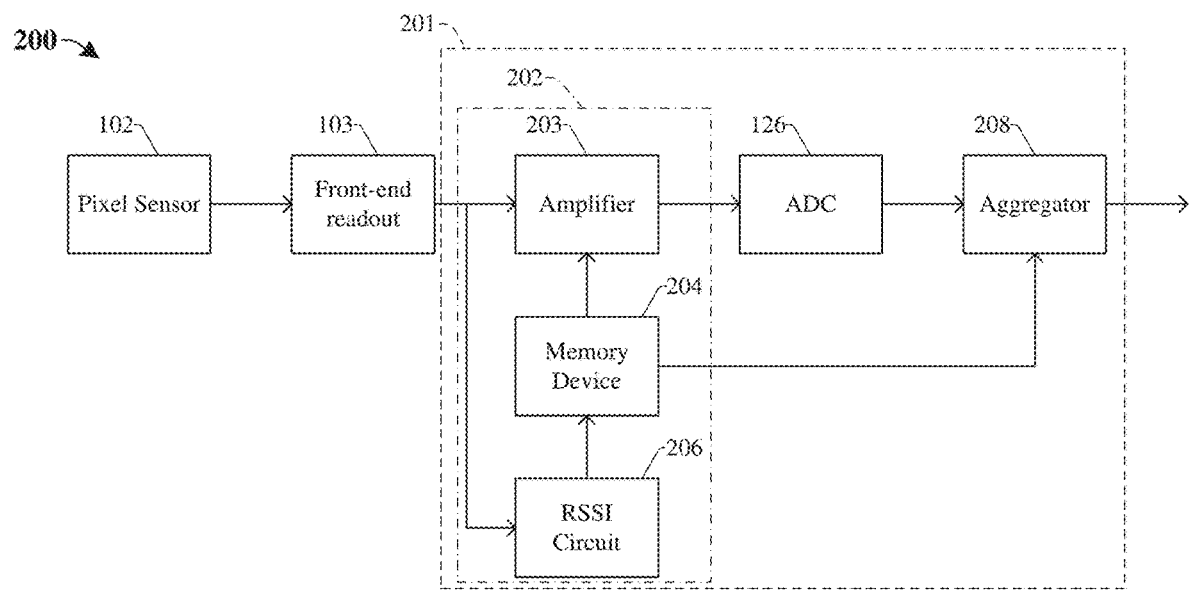
FIGS. 2A-B illustrate various diagrams of some embodiments of a readout integrated circuit (ROIC) architecture configured to set a gain for each pixel sensor in a pixel array according to Received Signal Strength Indicator (RSSI) bits of the corresponding pixel sensor.

FIG. 2A illustrates a block diagram of some embodiments of a readout integrated circuit (ROIC) architecture 200 configured to set a gain for each pixel sensor in a pixel array according to Received Signal Strength Indicator (RSSI) bits of the corresponding pixel, where the gain for each pixel sensor is determined at a column level.

In some embodiments, the ROIC architecture 200 includes a pixel sensor 102, a front-end readout circuit 103, and a readout circuit 201. The pixel sensor 102 is configured to absorb electromagnetic radiation (e.g., photons) and generate a corresponding pixel signal that corresponds to the electromagnetic radiation. In some embodiments, the electromagnetic radiation may, for example, be or comprise infrared radiation (e.g., wavelength values within a range of about 700 nanometers (nm) to 1 millimeter (mm)), visible light (e.g., wavelength values within a range of about 400 to 700 nm, or another suitable wavelength range. The pixel signal is subsequently input into a front-end readout circuit 103 and the pixel signal is input from the front-end readout circuit 103 to the readout circuit 201. In some embodiments, the pixel signal is a photocurrent from the pixel sensor 102.

The readout circuit 201 may comprise an automatic gain control amplifier (AGCA) 202, the ADC 126, and a digital aggregator 208. The readout circuit 201 is configured to receive the pixel signal from the pixel sensor 102 and/or the front-end readout circuit 103, generate a RSSI value based on the pixel signal, and generate a digital signal based on the RSSI value and the pixel signal. In further embodiments, the AGCA 202 comprises an amplifier 203, a memory device 204, and a RSSI circuit 206. The AGCA 202 may include a conversion element (e.g., a capacitor) coupled between an output of the front-end readout circuit 103 and an input of the amplifier 203, where the conversion element is configured to convert the pixel signal into an analog voltage. Further, the RSSI circuit 206 is configured to receive the analog voltage from the conversion unit and convert the analog voltage into RSSI bits that correspond to an RSSI value of the pixel sensor 102. The RSSI circuit 206 is configured to output the RSSI bits to the memory device 204, where the RSSI bits are stored in memory. The memory device 204 may supply the RSSI bits to the amplifier 203, and the amplifier 203 is configured to adjust a gain of the analog voltage according to the RSSI bits and output an analog signal to the ADC 126. By virtue of adjusting the gain for the analog voltage according to the RSSI bits, the analog voltage may, for example, be sufficiently increased to allow for proper signal detection while avoiding saturation. This, in part, increases intra-scene dynamic range for the pixel array. In some embodiments, the analog signal is configured as an in-column analog signal.

In addition, the analog signal of the amplifier 203 is converted by the ADC 126 into a digital signal. In some embodiments, an ADC resolution of the ADC 126 may be configured according to a resolution of the RSSI bits, such that, the ADC resolution may be decreased as the resolution of the RSSI bits is increased. This decreases a power consumption of the ROIC architecture while minimizing an adverse effect of noise on the performance of the ROIC architecture. Subsequently, the digital signal provided by the ADC 126 is input into a digital aggregator 208 and is combined with the RSSI bits to generate a readout signal that may be input into downstream processing devices. In yet further embodiments, the readout circuit 201 is configured to reconfigure downstream readout operations according to the RSSI bits.

Figure 2B:
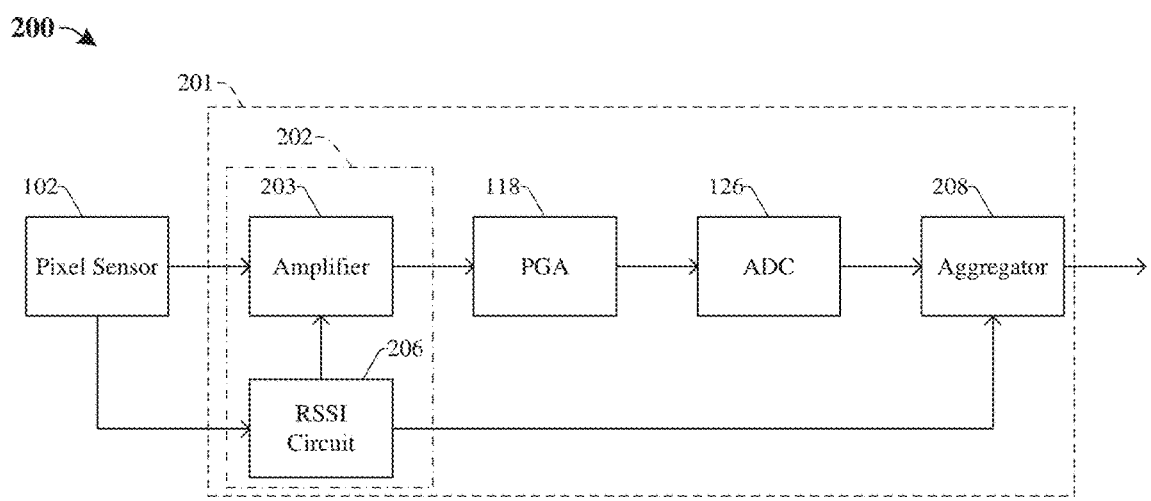

FIG. 2B illustrates a block diagram of some alternative embodiments of the ROIC architecture 200 of FIG. 2A, in which the RSSI circuit 206 is configured to generate the RSSI bits according to a photocurrent provided directly by the pixel sensor 102. In such embodiments, the RSSI circuit 206 may determine the RSSI bits on a pixel level, such that the AGCA 202 is configured to determine and set a gain value of the pixel sensor 102 at the pixel level, thereby reducing input-referred noise contributions from subsequent processing steps. Further, the analog voltage generated by the conversion element of the AGCA 202 is an in-pixel analog signal.

Figure 3A:
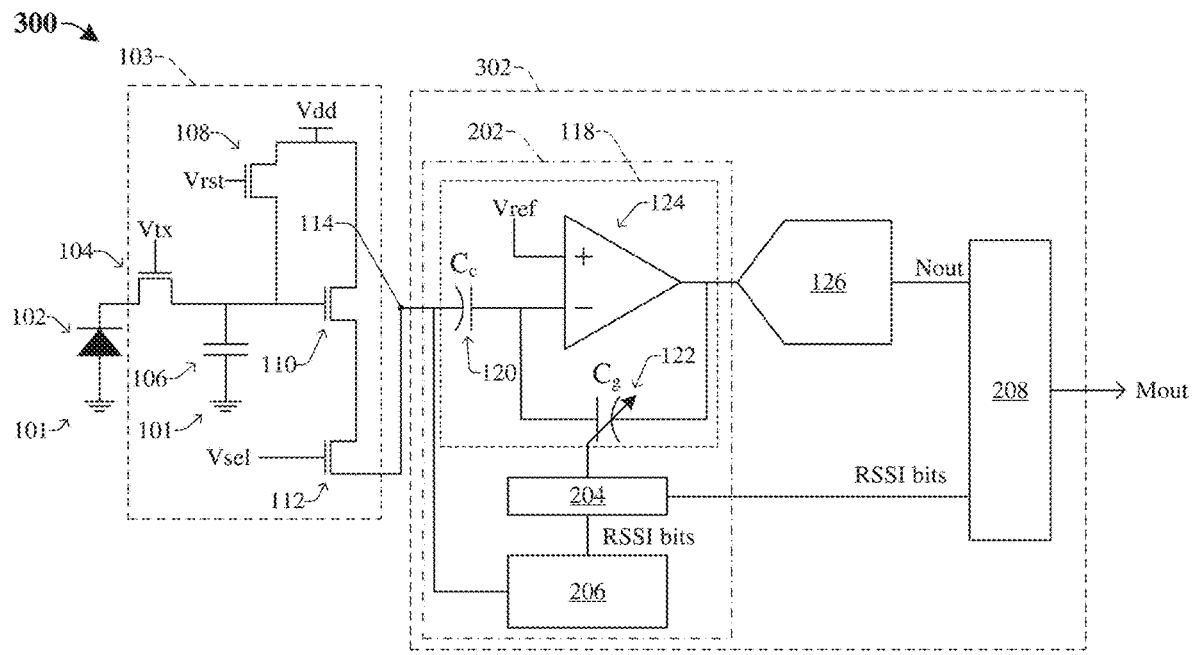
FIGS. 3A-D illustrate various diagrams of some embodiments of a ROIC architecture configured to set a gain for each pixel sensor in a pixel array at a column level according to RSSI bits of the corresponding pixel sensor.

FIG. 3A illustrates a block diagram 300 of some embodiments of an automatic gain readout circuit 302 that is configured to set a gain for each pixel in a pixel array according to a Received Signal Strength Indicator (RSSI) of the corresponding pixel. It will be appreciated that in some embodiments, the pixel sensor 102 may be part of an array of pixel sensors organized in a plurality of rows and a plurality of columns. In such embodiments, the automatic gain readout circuit 302 is configured to receive a generated electrical signal from a selected column of pixel sensors in the array of pixel sensors. In some embodiments, the automatic gain readout circuit 302 comprises an automatic gain control amplifier (AGCA) 202, the ADC 126, and a digital aggregator 208. The AGCA 202 comprises the PGA 118, a memory device 204, and a RSSI circuit 206. The AGCA 202 is configured to adjust signal gain levels for each pixel sensor within the array of pixel sensors according to RSSI value of a corresponding pixel sensor. An input of an RSSI circuit 206 is electrically coupled to the column input node 114. The RSSI circuit 206 is configured to determine a RSSI value of each pixel sensor in the array of pixel sensors and convert the RSSI values into RSSI bits. Subsequently, the RSSI bits of each pixel sensor is stored in a memory device 204 and output to a digital aggregator 208. Further, the memory device 204 is configured to supply the RSSI bits to the PGA 118 and the PGA 118 is configured to adjust a gain value of the PGA 118 according to the supplied RSSI bits. For example, the PGA 118 may be configured to adjust the capacitance $C_g$ of the gain capacitor 122 according to the RSSI bits, thereby setting a gain value for each pixel sensor. In addition, the memory device 204 is configured to output the RSSI bits to the digital aggregator 208 for downstream digital signal processing steps. In some embodiments, the digital aggregator 208 is configured to aggregate the column output signal Nout and the RSSI bits to an output signal Mout. In some embodiments, an overall bit depth of the ROIC architecture 200 is based on the RSSI bits and the column output signal Nout generated by the ADC 126. In further embodiments, the sum of the RSSI bits and the column output signal Nout may constitute the ROIC architecture's 200 overall bit depth, where the overall bit depth accommodates a total dynamic range (DR) of interest. Further, for example, increasing a resolution of the RSSI bits decreases the ADC resolution of the ADC 126, thereby decreasing a power consumption of the ROIC architecture 200. In yet further embodiments, a bit depth of the RSSI bits is less than the ADC resolution of the ADC 126. Thus, in some embodiments, an AGCA resolution of the AGCA 202 is less than the ADC resolution of the ADC 126.

Figure 3B:
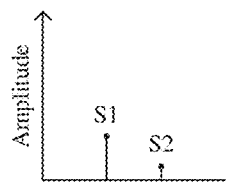
Figure 3C:
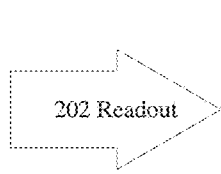
Figure 3C:
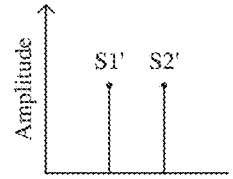

Thus, the automatic gain readout circuit 302 enhances intra-scene dynamic range and reduces readout power by using the RSSI bits to determine a gain value for each pixel sensor. For example, FIG. 3B illustrates some embodiments of a single frame of a first electrical signal S1 generated by a first pixel sensor in the pixel array and a second electrical signal S2 generated by a second pixel sensor in the pixel array. FIG. 3C illustrates some embodiments of the first and second electrical signals S1, S2 of FIG. 3B after being input into the AGCA 202, in which each signal is amplified by a per-pixel gain value to generate an amplified first electrical signal S1' and an amplified second electrical signal S2'. The per-pixel gain value for the first and second pixel sensors may be determined by corresponding RSSI bits generated by the RSSI circuit 206. For example, a first gain value for the first pixel sensor may be 2 (e.g., S1'=2*S1) and a second gain value for the second pixel sensor may be 7 (e.g., S2'=7*S2). Thus, the per-pixel gain may increase the SNR of each pixel sensor in the pixel sensor array while preventing the pixel sensors from reaching saturation, thereby increasing a performance of the automatic gain readout circuit 302.

Figure 3D:
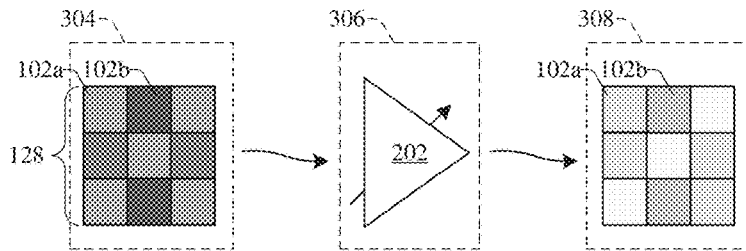

FIG. 3D illustrates a block diagram of some embodiments of a pixel array 128 being input into the AGCA 202. Block 304 illustrates a readout of the pixel array 128 before applying a per-pixel gain value to each pixel sensor within the pixel array 128. In some embodiments the pixel array 128 comprises a first pixel sensor 102a and a second pixel sensor 102b. Block 306 illustrates the pixel array 128 being input into the AGCA 202, where a per-pixel gain value is determined for each pixel sensor within the pixel array 128 by virtue of corresponding RSSI bits. Block 308 illustrates some embodiments of the pixel array 128 after applying the per-pixel gain to each pixel sensor within the pixel array 128. In some embodiments, a different gain value may have been applied to adjacent pixel sensors within the pixel array 128. For example, a first gain value for the first pixel sensor 102a may be 2 and a second gain value for the second pixel sensor 102b may be 4.

Further, as illustrated in FIG. 3A, the column output signal Nout and the RSSI bits are combined with the digital aggregator 208 to form the output signal Mout which in turn relaxes a bit resolution of the ADC 126. Reducing the ADC bit resolution leads to dramatic power and area savings. The RSSI bits may be used to adjust multiple functions to further save power, improve the overall imager performance, and enable intelligent context adaptive sensing (ICAS) in downstream digital signal processing stops. The additional functions provided by the RSSI bits will depend on the target imaging application and the readout architecture.

Figure 4:
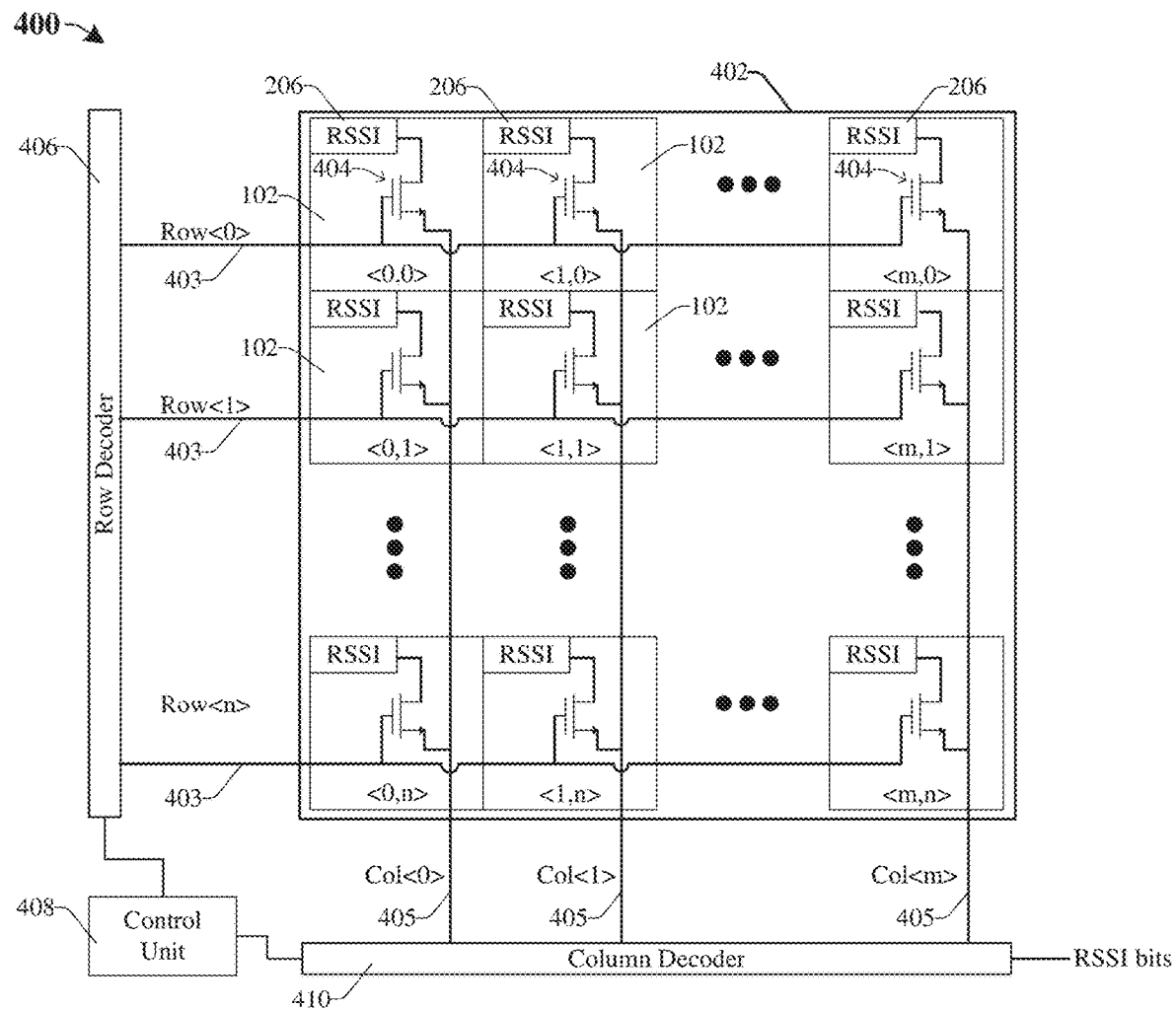
FIG. 4 illustrates a block diagram of some embodiments of a circuit having a pixel array that comprises a plurality of pixel sensors disposed within a plurality of rows and a plurality of columns.

FIG. 4 illustrates a block diagram of some embodiments of a circuit 400 having a pixel array 402 that comprises a plurality of pixel sensors 102 disposed within a plurality of rows and a plurality of columns. Each pixel sensor 102 comprises an RSSI circuit 206, an RSSI access device 404, and a photodetector (not shown). The photodetector is configured to convert incident electromagnetic radiation to electrical signals. In some embodiments, the RSSI access device 404 may be configured as a transistor. Further, the RSSI circuit 206 is configured to determine an RSSI value of a corresponding pixel sensor 102 and output RSSI bits that correspond to the RSSI value of the corresponding pixel sensor 102. In yet further embodiments, each RSSI circuit 206 may comprise a memory circuit configured to store the RSSI value and/or RSSI bits associated with the corresponding pixel sensor 102. In addition, the circuit 400 includes a row decoder 406 that is operably coupled to a plurality of row lines 403, a column decoder 410 that is operably coupled to a plurality of column lines 405, and a control unit 408 configured to control the row decoder 406 and the column decoder 410. The control unit 408 may supply an address to the row decoder 406 and the column decoder 410 such that RSSI bits corresponding to a pixel sensor 102 associated with the address may be accessed at an output of the column decoder 410. The control unit 408 may, for example, comprise a microprocessor circuit. In some embodiments, each RSSI circuit 206 includes a ripple counter circuit comprising a plurality of flip-flops (e.g., a 4-bit ripple counter circuit). The RSSI bits stored in the plurality of RSSI circuits 206 may represent a coarse digital readout integrated circuit (DROIC) image (e.g., a 4-bit digital image) that may be accessed through the row and column decoders 406, 410 during any step of the readout chain. Row and column addresses can be sequentially toggled until all RSSI bits associated with each pixel sensor 102 within the pixel array 402 are output. In yet further embodiments, all RSSI bits may be readout to a memory device (e.g., 204 of FIG. 2A) before performing a readout process on the pixel sensors 102, such that the RSSI bits may be used to set a per-pixel gain of each pixel sensor 102 during the readout chain. For example, the RSSI bits may be determined before and/or during a calibration process performed on the pixel array 402, such that the RSSI bits are stored within the RSSI circuits 206 and/or within the memory device (e.g., 204 of FIG. 2A). Thus, during a first readout mode a signal level utilized to determine the RSSI bits may be sensed during and/or before the calibration process and the RSSI bits may be accessed during any subsequent readouts.

Moreover, the coarse DROIC image of the RSSI bits can be read in advance and then used to reconfigure other digitally programmable settings in the subsequent readouts. This will enable a ROIC to learn about the scene and make intelligent programmable register manipulations to enable complex intelligent context adaptive sensing functions on a frame-by-frame basis. Furthermore, this coarse DROIC image can be used for low resolution sparse sampling in compressive sensing applications. The column and row decoders 406, 410 can be programmed to read the coarse DROIC image in any order suitable for a given compression algorithm. The additional functions enabled by the RSSI bits will depend on the ROIC architecture and target imaging application.

Figure 5:
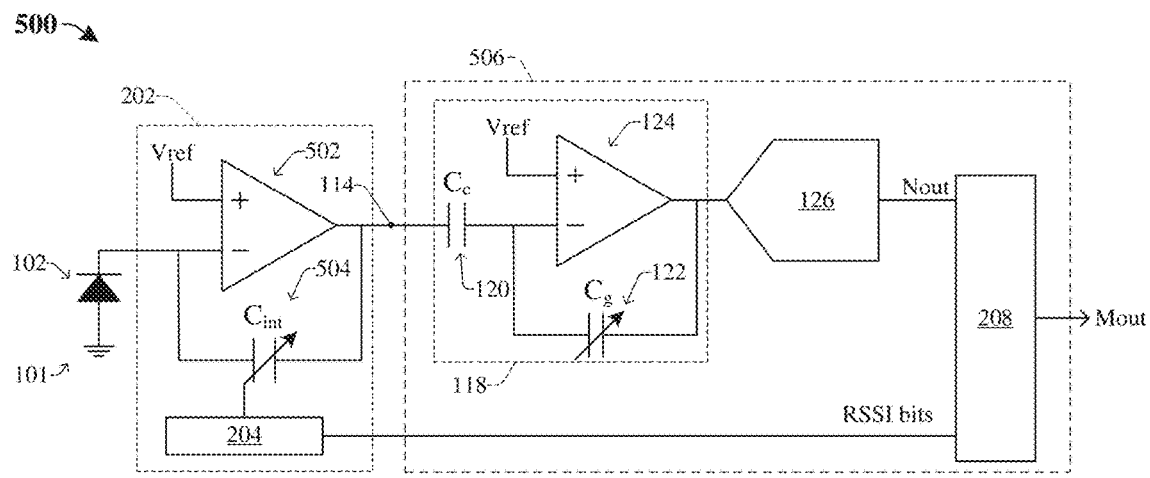
FIG. 5 illustrates a block diagram of some embodiments of an automatic pixel gain circuit configured to set a gain for each pixel sensor in a pixel array at a pixel level according to corresponding RSSI bits.

FIG. 5 illustrates a block diagram of some embodiments of an automatic pixel gain circuit 500. The automatic pixel gain circuit 500 comprises a pixel sensor 102, an AGCA 202, and a readout circuit 506. In some embodiments, the AGCA 202 comprises a feedback amplifier 502, a variable integration capacitor 504, and a memory device 204. In further embodiments, the pixel sensor 102 and the AGCA 202 may be referred to as a capacitive transimpedance amplifier (CTIA) pixel. The pixel sensor 102 is configured to absorb electromagnetic radiation (e.g., photons) and generate electrical signals corresponding to the electromagnetic radiation. Further, the pixel sensor 102 is electrically coupled to an inverting node of a feedback amplifier 502, and the variable integration capacitor 504 is electrically coupled between the inverting node of the feedback amplifier 502 and an output of the feedback amplifier 502. The variable integration capacitor 504 has a capacitance $C_{int}$ that is configured to set a gain value of the feedback amplifier 502. The memory device 204 is electrically coupled to the variable integration capacitor 504 and is configured to change a value of the capacitance $C_{int}$ according to RSSI bits associated with the pixel sensor 102. In some embodiments, during a first readout mode, the pixel sensor 102 comprises an RSSI circuit (e.g., 206 of FIG. 4) that is configured to supply RSSI bits corresponding to an RSSI value of the pixel sensor 102 to the memory device 204. The RSSI bits may be provided to the memory device 204 before performing a readout process on the pixel sensor 102. Further, the memory device 204 may adjust the gain of the feedback amplifier 502 according to the RSSI bits. Subsequently, the memory device 204 and/or the RSSI circuit may supply the RSSI bits to the ADC 126 to lower a resolution of the ADC 126, thereby reducing a power of the ADC 126 and increasing an overall performance of the automatic pixel gain circuit 500. The output of the AGCA 202 is supplied to a column input node 114 and subsequently input into the readout circuit 506, wherein the readout circuit 506 comprises the PGA 118, the ADC 126, and the digital aggregator 208. In some embodiments, the feedback amplifier 124 of the PGA 118 may have a fixed gain value while the feedback amplifier 124 of the AGCA 202 has a variable gain value that is set by RSSI bits received from the memory device 204.

It will be appreciated that in some embodiments, the pixel sensor 102 may be part of an array of pixel sensors organized in a plurality of rows and a plurality of columns (e.g., see FIG. 4). In such embodiments, each pixel sensor may be electrically coupled to a feedback amplifier 502 and a variable integration capacitor 504, such that each pixel sensor is configured as a CTIA pixel. The memory device 204 is electrically coupled to each variable integration capacitor 504 and is configured to set the capacitance $C_{int}$ of the corresponding variable integration capacitor 504 according to RSSI bits that correspond to the associated pixel sensor. Thus, the RSSI bits may be used to adjust per-pixel gain on a pixel level before reaching the column input node 114. In such embodiments, the automatic pixel gain circuit 500 may be operating in a first readout mode where the RSSI bits may be accessed globally at any readout processing step via the memory device 204 and/or a RSSI circuit (e.g., 206 of FIG. 4).

Figure 6:
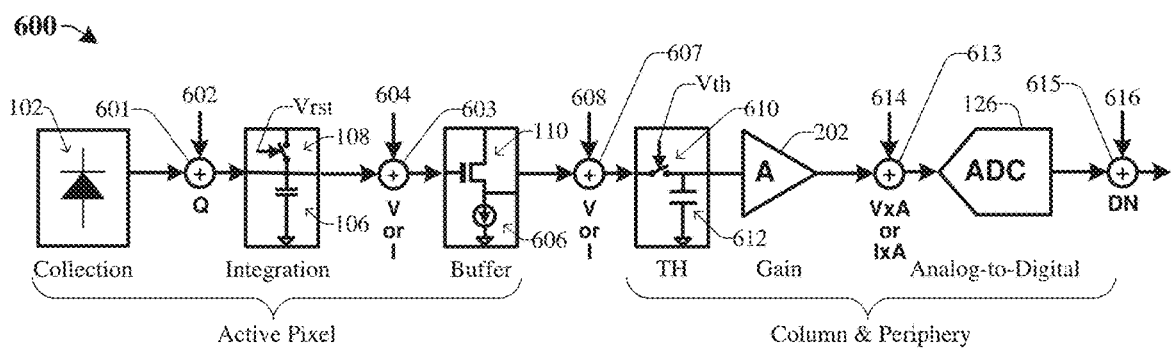
FIG. 6 illustrates a block diagram of some embodiments of a pixel signal readout chain that illustrates various noise sources introduced to a ROIC during a readout process.

FIG. 6 illustrates a block diagram 600 of some embodiments of a pixel signal readout chain that illustrates various noise sources introduced to a ROIC during a readout process. The pixel signal readout chain has a collection step that includes a pixel sensor 102 outputting an electrical signal to a first adder 601, where the pixel sensor generates the electrical signal based off of incident electromagnetic radiation. The electrical signal generated by the pixel sensor 102 is combined with pixel sensor noise 602 (as illustrated by the first adder 601) and subsequently input into an integration step. In some embodiments, the pixel sensor noise 602 includes photocurrent shot noise, dark current noise, light fixed-pattern noise (FPN), dark FPN, pixel crosstalk, hot pixels, other noise sources, or any combination of the foregoing. At the integration step, the electrical signal is operably coupled to a source/drain region of the reset transistor 108 and a terminal of the storage capacitor 106. The electrical signal is then output from the integration step, combined with reset noise 604 (as illustrated by a second adder 603), and subsequently input into a buffer step. In some embodiments, the reset noise 604 includes light FPN, dark FPN, photodiode reset noise (e.g., kT/C noise), other noise sources, or any combination of the foregoing.

At the buffer step, the electrical signal is applied to a gate electrode of the source follower transistor 110. A first source/drain region of the source follower transistor 110 is electrically coupled to a power supply (e.g., a DC power supply) configured to supply a voltage (e.g., Vdd of FIG. 3A). A second source/drain region of the source follower transistor 110 is electrically coupled to an output node and a current source 606. Another electrical signal is then output from the buffer step, combined with buffer noise 608 (as illustrated by a third adder 607), and subsequently input into a track and hold (TH) step (e.g., input to the column input node 114 of FIG. 3A). In some embodiments, the buffer noise 608 includes thermal noise, low-frequency noise, other noise sources, or any combination of the foregoing. At the TH step, the another electrical signal is operably coupled to a first source/drain region of a TH transistor 610 and may be output to a TH capacitor 612 through suitable application of a TH voltage Vth to a gate electrode of the TH transistor 610. Subsequently, the another electrical signal is output from the TH step to a gain step. In some embodiments, at the gain step the another electrical signal is input into the AGCA 202 to set a per-pixel gain value of the another electrical signal according to RSSI bits of the pixel sensor 102. In yet further embodiments, the gain step may include inputting the another electrical signal into the PGA 118 to apply a fixed gain value to the another electrical signal (not shown). Further, the another electrical signal is output from the gain step, combined with gain noise 614 (as illustrated by a fourth adder 613), and subsequently input into an analog-to-digital step. At the analog-to-digital step, the another electrical signal is converted from an analog signal to a digital signal and subsequently output for further signal processing (e.g., input into the digital aggregator 208 of FIG. 3A). During the analog-to-digital step, the another electrical signal is combined with quantization noise 616 (as illustrated by a fifth adder 615) as a result of the ADC 126. It will be appreciated that the AGCA 202 being configured to set a per-pixel gain value of the another electrical signal according to RSSI bits of the pixel sensor 102 decreases a presence and/or effect of the plurality of noise sources 602, 604, 608, 614, 616 on the another electrical signal during subsequent processing steps, thereby increasing a performance of the pixel signal readout chain.

The pixel collection and storage capacitor 106 are modeled independently to separately control the full well (FW) and conversion gain. The active pixel includes in-pixel buffering which can be a source follower (SF) or a CTIA depending on the buffering needed for a particular photodiode (PD) detector. The pixel analog output (e.g., voltage (V) or current (I)) is then sampled, gained, and quantized to a digital number or count (DN).

Figure 7:
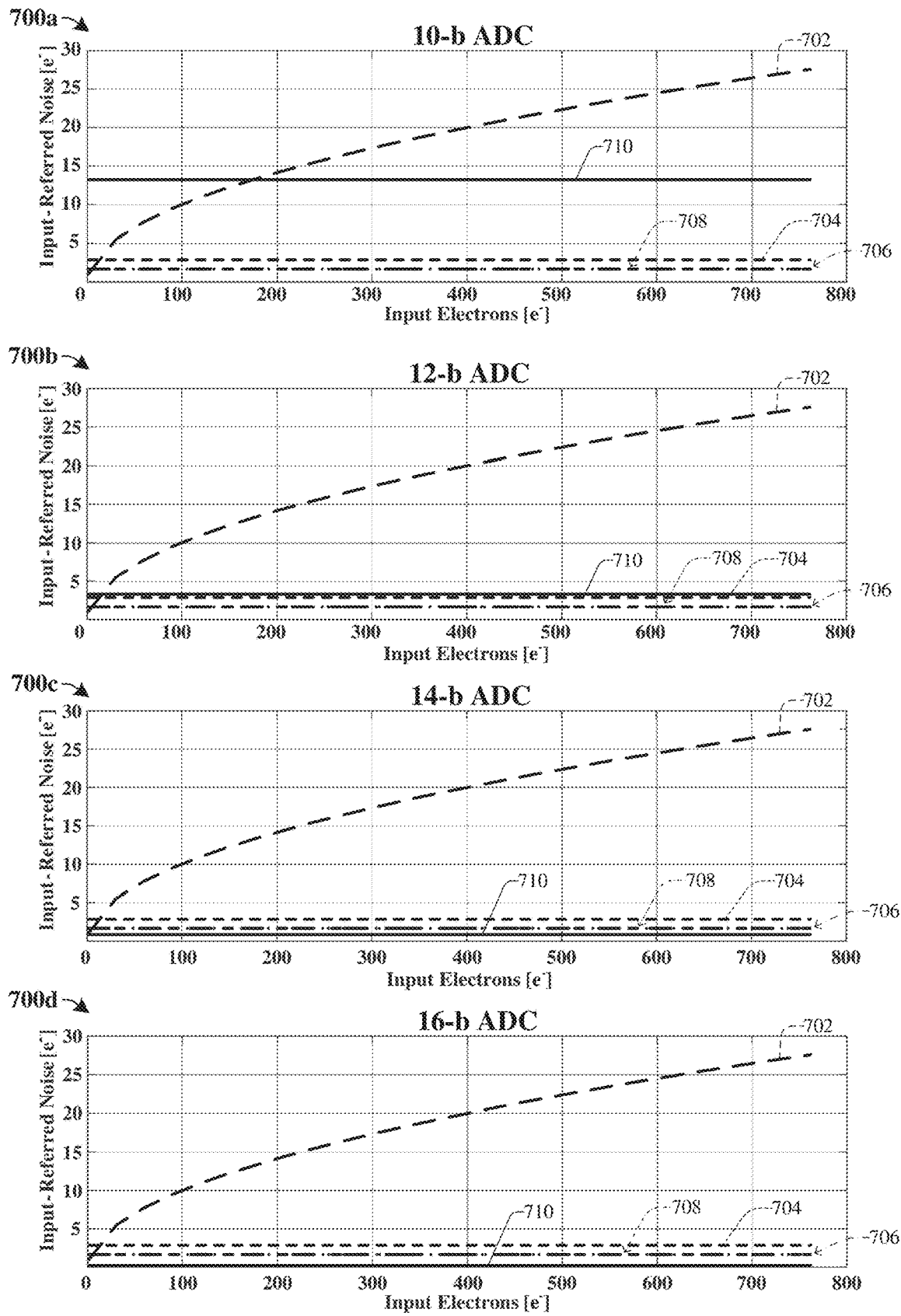
FIG. 7 illustrates various graphs of some embodiments of input-referred noise versus different input signal levels according to a readout architecture that is configured to adjust the gain of a pixel sensor to a fixed gain value.

FIG. 7 illustrates various graphs 700a-d of some embodiments of input-referred noise versus different input signal levels according to a readout architecture that is configured to adjust the gain of a pixel sensor to a fixed gain value (e.g. according to the readout architecture of FIGS. 1A-D) at different ADC resolution values. The graphs 700a-d illustrate input referred noise from all readout blocks (e.g., each readout step of FIG. 6) to examine sensitivity at a theoretical 0 dB minimum SNR. The SNR is examined over the entire signal range and up to the maximum FW. In some embodiments, for a FW of ~100 Ke–, a minimum of 9-bits of ADC depth is needed (SNR=√FW) for readout architecture that is configured to adjust the gain of a pixel sensor to a fixed gain value (e.g. the readout architecture of FIGS. 1A-D). However, imaging systems with such FW capacity consider 12-16 bit ADCs to increase sensitivity at the expense of an increase in power consumption. Each graph 700a-d comprises noise curves 702-710 that correspond to different noise sources present during a readout process performed on a pixel readout architecture. For example, a first noise curve 702 corresponds to the pixel sensor noise (602 of FIG. 6), a second noise curve 704 corresponds to the reset noise (604 of FIG. 6), a third noise curve 706 corresponds to the buffer noise (608 of FIG. 6), a fourth noise curve 708 corresponds to the gain noise (614 of FIG. 6), and a fifth noise curve 710 corresponds to the quantization noise (616 of FIG. 6).

A first graph 700a illustrates the readout architecture (e.g., the readout architecture of FIGS. 1A-D) with an ADC (126 of FIG. 1A) having an ADC resolution value (i.e., ADC bit depth) of 10-bits, a second graph 700b illustrates the ADC having an ADC resolution of 12-bits, a third graph 700c illustrates the ADC having an ADC resolution of 14-bits, and a fourth graph 700d illustrates the ADC having an ADC resolution of 16-bits. As the ADC resolution value increases, quantization noise is decreased below all other noise contributors. For example, a 14-bit ADC bit depth is high enough to bring quantization noise, as illustrated by the fifth noise curve 708, well below all noise contributors. Note that, in some embodiments, as other circuit blocks are optimized for lower noise, a higher ADC bit resolution is needed.

Figure 8:
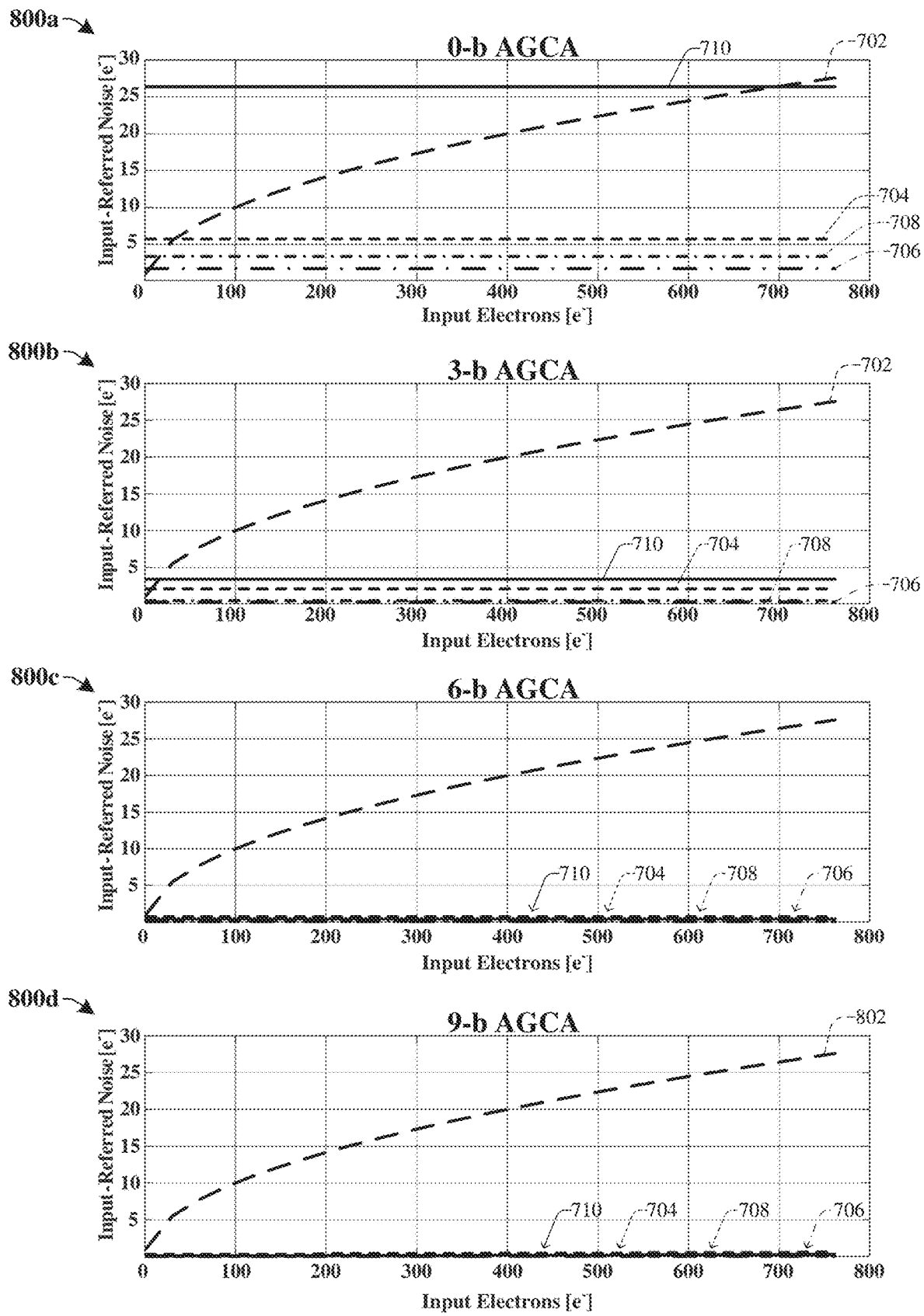
FIG. 8 illustrates various graphs of some embodiments of input-referred noise versus different input signal levels according to a ROIC architecture configured to set a gain for each pixel sensor in a pixel array according to corresponding RSSI bits.

FIG. 8 illustrates various graphs 800a-d of some embodiments of input-referred noise versus different input signal levels according to a ROIC architecture configured to set a gain for each pixel sensor in a pixel array according to RSSI bits of the corresponding pixel sensor at different AGCA resolution values. In some embodiments, the ROIC architecture may be configured as illustrated and/or described in, for example, FIGS. 2A-B, 3A-D, 4, and/or 5.

A first graph 800a corresponds to the AGCA 202 being electrically coupled to an ADC 126 where the AGCA 202 is configured with an AGCA resolution of 0-bits, a second graph 800b corresponds to the AGCA 202 having an AGCA resolution of 3-bits, a third graph 800c corresponds to the AGCA 202 having an AGCA resolution of 6-bits, and a fourth graph 800d corresponds to the AGCA 202 having an AGCA resolution of 9-bits. In some embodiments, the AGCA resolution corresponds to a resolution of the RSSI bits provided to the AGCA 202. In such embodiments, the RSSI bits may be output by the AGCA 202 by way of a memory circuit and/or an RSSI circuit to be combined with the output bits of the ADC 126. In further embodiments, the ADC 126 may, for example, have an ADC resolution of 10-bits in the graphs 800a-d. In some embodiments, the AGCA resolution may be referred to as an AGCA bit depth. As illustrated in the graphs 800a-d, using the RSSI bits to determine per-pixel gain settings may relax the bit depth requirement of the ADC 126 and increases intra-scene dynamic range. The per-pixel gain will be set to fill the ADC dynamic range of the ADC 126 each time a pixel sensor is readout. In some embodiments, with the ROIC architecture having a CTIA based pixel, the signal level is sensed globally during the first readout mode and the corresponding RSSI bits are latched per-pixel (e.g., see FIG. 5).

Figure 9:
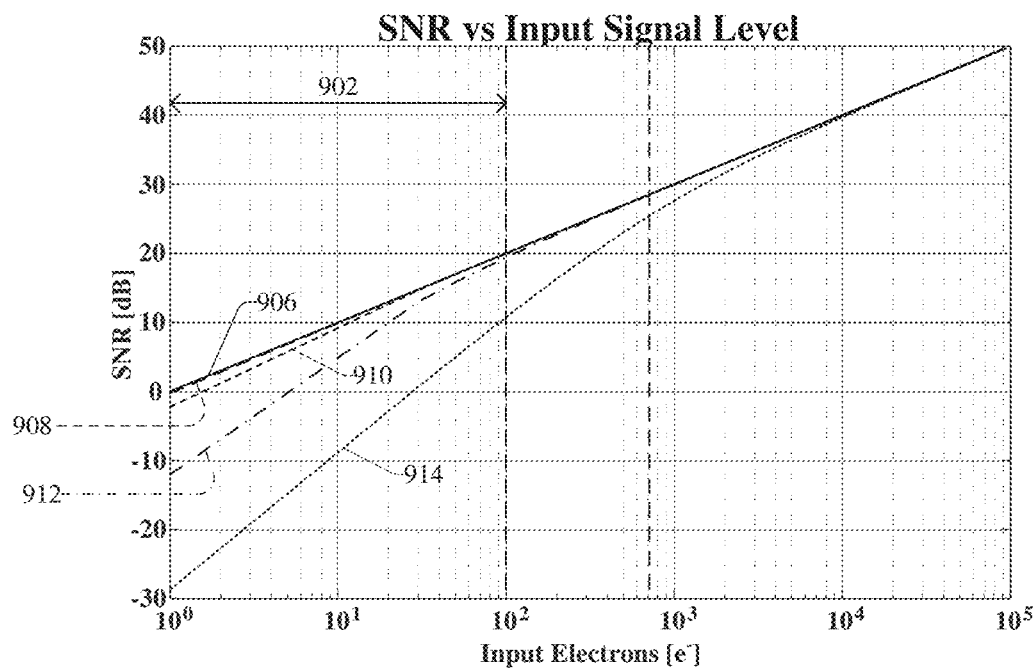
FIG. 9 illustrates a graph of some embodiments of SNR of a pixel sensor versus different input signal levels according to the ROIC architecture configured to set a gain for each pixel sensor in a pixel array according to corresponding RSSI bits.
Figure 10:
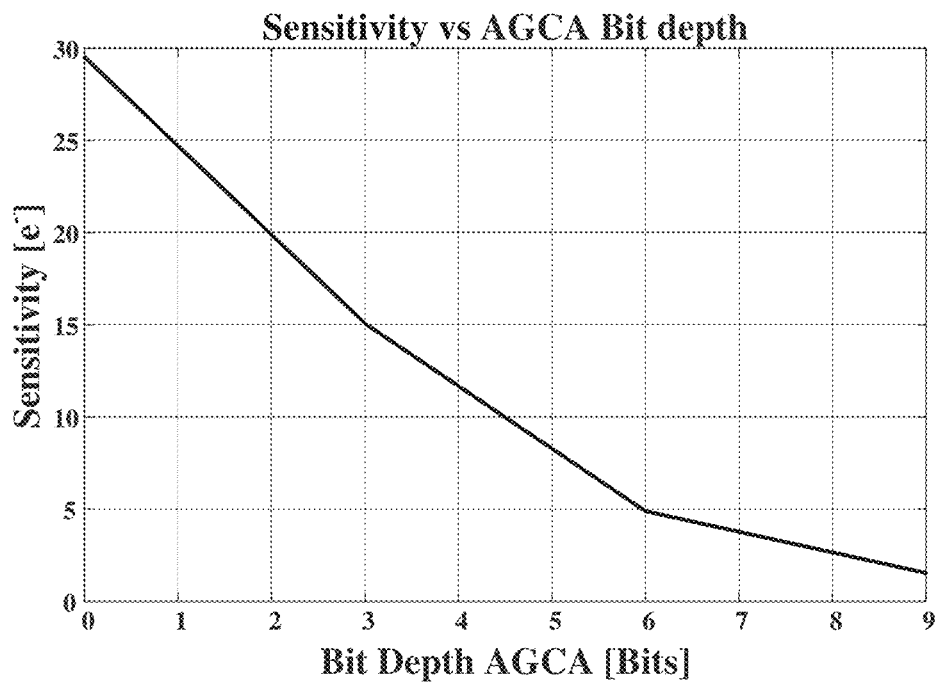
FIG. 10 illustrates a graph of some embodiments of sensitivity of a pixel sensor versus different AGCA bit resolution values.

FIG. 9 illustrates a graph of some embodiments of SNR of a pixel sensor versus different input signal levels according to the ROIC architecture configured to set a gain for each pixel sensor in a pixel array according to RSSI bits of the corresponding pixel sensor. A first SNR curve 906 corresponds to the SNR of a pixel sensor at a FW capacity, a second SNR curve 908 corresponds to the SNR of a pixel sensor with the AGCA 202 having an AGCA resolution of 9-bits, a third SNR curve 910 corresponds to the SNR of a pixel sensor with the AGCA 202 having an AGCA resolution of 6-bits, a fourth SNR curve 912 corresponds to the SNR of a pixel sensor with the AGCA 202 having an AGCA resolution of 3-bits, and a fifth SNR curve 914 corresponds to the SNR of a pixel sensor with the AGCA 202 having an AGCA resolution of 0-bits. In some embodiments, increasing the AGCA resolution of the AGCA 202 increases the SNR of the pixel sensor in a low signal region 902. FIG. 10 illustrates a graph of some embodiments of sensitivity of a pixel sensor versus different AGCA resolution values of the AGCA 202. As the AGCA resolution is increased, a sensitivity of the ROIC architecture is increased.

The ROIC architecture enables manipulation of the input referred noise more effectively by keeping the ADC at a lower resolution, for example 10-bits or lower, while using the RSSI bits for the AGCA 202 to adjust the in-pixel gain. The upfront gain in the analog signal chain (ASC) not only lowers the ADC power budget but also significantly reduces the input-referred noise contributions from subsequent readout blocks, as illustrated in graphs 800a-d of FIG. 8. In further embodiments, this significant reduction in noise may bring the sensitivity of the ROIC architecture near the single electron limits as illustrated in FIG. 10.

In some embodiments, the ROIC architecture utilizes RSSI bits to determine the per-pixel gain setting during a first readout mode. The RSSI bits may be used to set the AGCA resolution and fill the ADC dynamic range every time a pixel is read out. The per-pixel AGCA approach can be applied on either the pixel or column level. In further embodiments, the ROIC architecture utilizing the RSSI bits can significantly improve sensitivity compared with a conventional PGA read out architecture even when using a lower ADC resolution. In yet further embodiments, the in-pixel AGCA, with gain added closer to the front-end of the ASC, improves overall pixel sensitivity. In some embodiments, by utilizing the RSSI bits, an average output signal digital number (DN) equivalent in a relatively low ADC resolution (e.g., equal to or less than a 10-bit ADC resolution) remains closer to the ADC full-scale over the input signal range.

Figure 11:
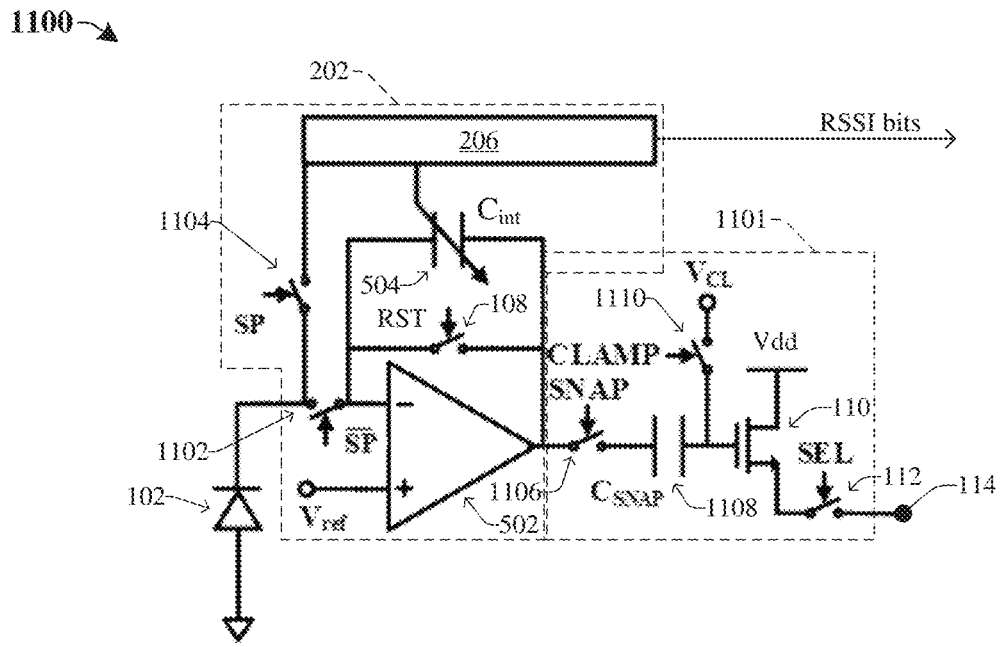
FIG. 11 illustrates a block diagram of some embodiments of an automatic pixel gain circuit configured to set a gain value for each pixel sensor in a pixel array according to corresponding RSSI bits provided by an RSSI circuit.

FIG. 11 illustrates a block diagram of some embodiments of an automatic pixel gain circuit 1100. The automatic pixel gain circuit 1100 comprises a pixel sensor 102, an AGCA 202, and a front-end readout circuit 1101. In some embodiments, the AGCA 202 comprises a first transistor 1102, a second transistor 1104, the RSSI circuit 206, the feedback amplifier 502, the reset transistor 108, and the variable integration capacitor 504. An output of the AGCA 202 is input into the front-end readout circuit 1101. In further embodiments, the front-end readout circuit 1101 includes a snap transistor 1106, a snap capacitor 1108 with a snap capacitance $C_{SNAP}$, a clamp transistor 1110, the source follower transistor 110, and the select transistor 112. An output signal of the front-end readout circuit 1101 may be electrically coupled to a column input node 114 that is operably coupled to an ADC (126 of FIG. 5). In yet further embodiments, the automatic pixel gain circuit 1100 may be referred to as a snap-shot CTIA pixel.

The first transistor 1102 is electrically coupled between the pixel sensor 102 and the inverting node of the feedback amplifier 502. The second transistor 1104 is electrically coupled between the RSSI circuit 206 and the inverting node of the feedback amplifier 502. The reset transistor 108 is electrically coupled between the inverting node of the feedback amplifier 502 and an output of the feedback amplifier 502. Further, the variable integration capacitor 504 is electrically coupled between the inverting node of the feedback amplifier 502 and the output of the feedback amplifier 502. The variable integration capacitor 504 has a capacitance $C_{int}$ that is configured to set a gain value of the feedback amplifier 502. The RSSI circuit 206 is electrically coupled to the variable integration capacitor 504 and is configured to change a value of the capacitance $C_{int}$ according to RSSI bits associated with the pixel sensor 102. In some embodiments, during a first readout mode, the RSSI circuit 206 may be configured to supply the RSSI bits to a memory device (e.g., 204 of FIG. 4) that is configured to supply the RSSI bits corresponding to an RSSI value of the pixel sensor 102 to the variable integration capacitor 504.

In some embodiments, the pixel sensor 102 is part of a pixel array that comprises a plurality of pixel sensors disposed in rows and columns. Further, the automatic pixel gain circuit 1100 may be configured for an Integrate-Then-Read (ITR) operation in which all pixel sensors simultaneously integrate their corresponding photocurrents. This utilizes an in-pixel analog storage unit, such as the snap capacitor 1108, to capture the integrated photocurrent after a global shutter is applied to the entire pixel array. Subsequently, an output signal of the front-end readout circuit 1101 may be accessed at the column input node 114 through the source follower transistor 110 and the select transistor 112.

Figure 12:
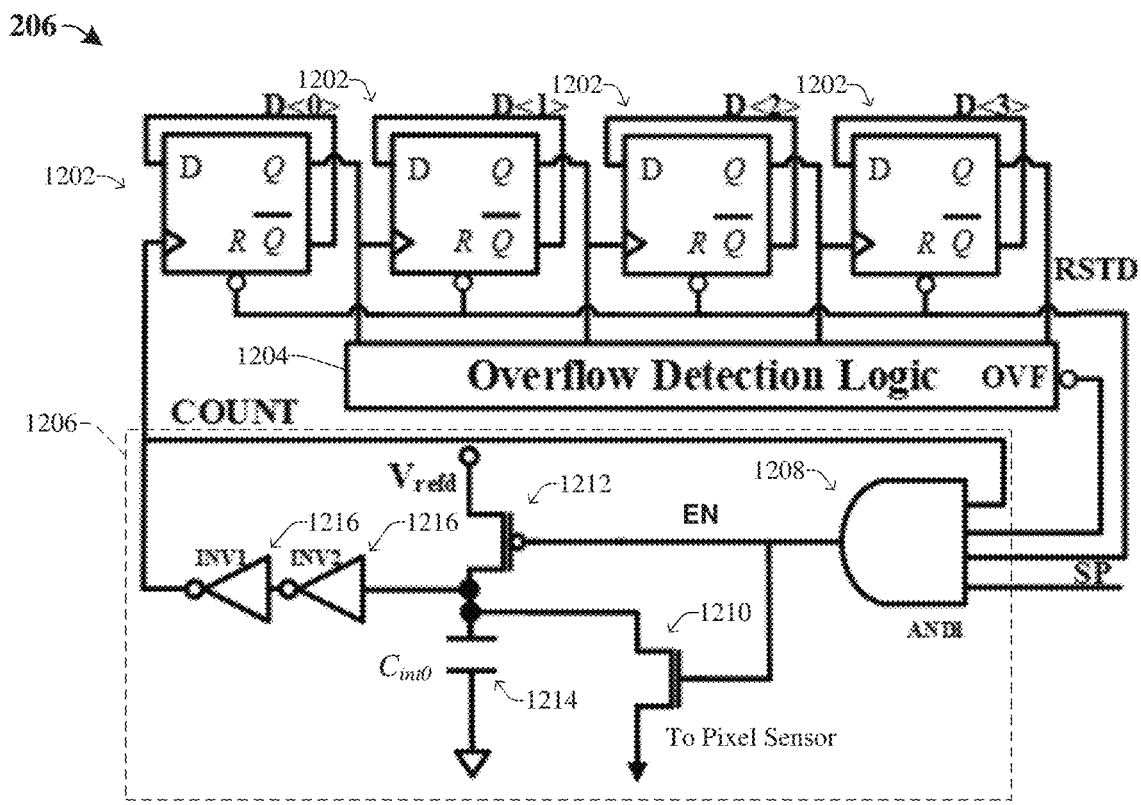
FIG. 12 illustrates a block diagram of some embodiments of the RSSI circuit of FIG. 11.

FIG. 12 illustrates a block diagram of some embodiments of the RSSI circuit 206. In some embodiments, the RSSI circuit 206 comprises a plurality of flip-flops 1202 configured to store RSSI bits associated with the pixel sensor 102. An output of each flip-flop 1202 is input into an overflow detection logic circuit 1204 that is configured to generate an overflow detector (OVF) signal. Further, the flip-flops 1202 are configured to generate a digital reset (RSTD) signal according to the stored RSSI bits. The RSSI circuit 206 further comprises a count pulse generator circuit 1206. The RSTD signal and OVF signal are input into an AND block 1208 with a COUNT signal and a first readout mode signal SP. The AND block 1208 is configured to generate an enable signal EN that is output to a gate electrode of a first transistor 1212 and a second transistor 1210. Source/drain regions of the first transistor 1212 are electrically coupled between a power supply (e.g., a DC power supply), configured to supply a voltage $V_{refd}$, and an integration capacitor 1214. The integration capacitor 1214 has a capacitance $C_{int0}$. Further, the second transistor 1210 is electrically coupled between the photodiode of the pixel sensor 102 and the integration capacitor 1214. Further, inversion blocks 1216 are electrically coupled to source/drain regions of the first and second transistors 1212, 1210. In some embodiments, the inversions blocks 1216 may be constructed by NAND block(s), NOR block(s), other suitable logic blocks, or any combination of the foregoing.

Figure 13:
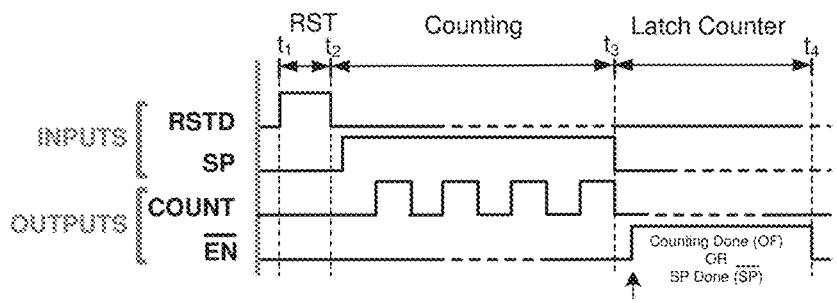
FIG. 13 illustrates a timing diagram of some embodiments of operating the RSSI circuit of FIG. 12 during a first readout mode.

In some embodiments, with reference to FIGS. 12 and 13, prior to propagating the RSSI bits to column circuitry (e.g., the digital aggregator 208 of FIG. 2A) and the analog pixel outputs to the column circuitry (e.g., the ADC 126 of FIG. 2A), the RSTD signal and first readout mode signal SP are generated. These signals are generated globally during the first readout mode to clear or reset the in-pixel ripple counter (e.g., the flip flops 1202), initiate counting, and then latch the generated RSSI bits used to set the gain of the feedback amplifier 502 (i.e., the per-pixel gain).

In some embodiments, the signal levels from each pixel sensor in the array may be sensed globally during the first readout mode to determine the RSSI bits of the corresponding pixel sensor such that the RSSI bits may be latched per-pixel. Thus, in some embodiments, the RSSI circuit 206 is configured to determine the RSSI bits. FIG. 13 illustrates some embodiments of a timing diagram 1300 according to operation of the RSSI circuit 206 of FIG. 12 during the first readout mode. In some embodiments, between times $t_1$ and $t_2$ of the first readout mode, the flip-flops 1202 are initially reset to initialize its asynchronous ripple counter starting value and initialize the count pulse generator circuit 1206. There are three active-low control inputs that will disable the COUNT signal, namely, the RSTD signal, the OVF signal, and the first readout mode signal SP. When all the active-low controls are high, the circuit functions as an inverter chain with its output tied to the input. During the counting period of the first readout mode (e.g., between times $t_2$ and $t_3$), the time spent low is controlled predominantly by the delays of the inversion blocks 1216. Further, the time spent high is regulated predominantly by how quickly the current from the photodiode of the pixel sensor 102 can discharge the integration capacitor 1214 and this period is given by the equation:

$$T = \frac{V_{refd}}{2}\left(\frac{C_{into}}{I_{pd}}\right) + 2(2t_{inv} + t_{and}),$$

where $I_{pd}$ is the photodiode current provided by the photodiode of the pixel sensor 102, $t_{inv}$ is the inversion delay of the inversion blocks 1216, $C_{int0}$ is the capacitance of the integration capacitor 1214, and Go is the delay of the AND block 1208.

In some embodiments, if T is relatively low, then the photodiode current $I_{pd}$ is high and the counter is relatively quick, such that the corresponding RSSI bits of the pixel sensor is relatively high. Thus, in such embodiments, the capacitance $C_{int}$ of the variable integration capacitor 504 will be set relatively high based on the RSSI bits, such that a per-pixel gain value of the feedback amplifier 502 will be relatively low (e.g., because a gain of the feedback amplifier is inversely proportional to the capacitance $C_{int}$). In further embodiments, if T is relatively high, then the photodiode current $I_{pd}$ is low and the counter is relatively slow, such that the corresponding RSSI bits of the pixel sensor is relatively low. Thus, in such embodiments, the capacitance $C_{int}$ of the variable integration capacitor 504 will be set relatively low based on the RSSI bits, such that a per-pixel gain value of the feedback amplifier 502 will be relatively high (e.g., because a gain of the feedback amplifier is inversely proportional to the capacitance $C_{int}$).

In some embodiments, because of wide variability in the dark current of infrared (IR) pixels, the integration capacitor 1214 is sized according to the photodiode current $I_{pd}$. In further embodiments, adjustments to the size of the integration capacitor 1214, the reference voltage $V_{refd}$ and the first and second transistors 1212, 1210 can be tuned to accommodate a specific photodiode current range and desired integration time. Subsequent count pulses are generated through the repeated charge and reset cycles of the integration capacitor 1214 as long as the gate and RC delays (Td) during reset are longer than the delays during the charge operation. During the latch counter period of the first readout mode (e.g., between times $t_3$ and $t_4$), the counter is disabled and its RSSI bits (e.g., D<3:0>) are latched into the flip-flops 1202 upon reaching the maximum count or at the end of the first readout mode. A maximum count result is signaled through overflow detection logic. In some embodiments, for reduced pixel pitch applications, the area of both the OR and overflow logic circuitry can be minimized by using NMOS only logic implementation.

Figure 14:
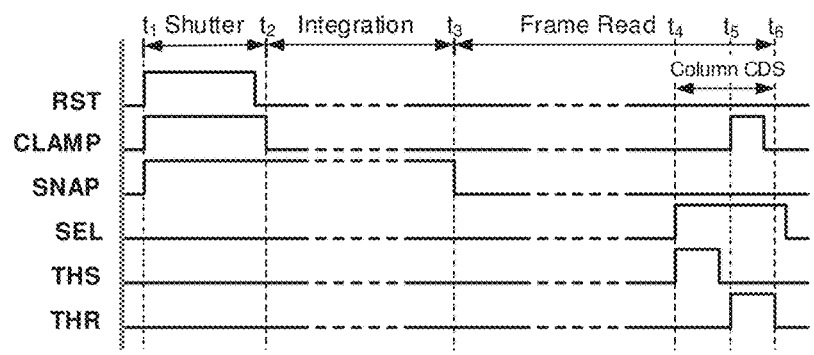
FIG. 14 illustrates a timing diagram of some embodiments of operating the automatic pixel gain circuit of FIG. 11.

FIG. 14 illustrates some embodiments of a timing diagram 1400 that illustrates operation of the automatic pixel gain circuit 1100 of FIG. 11. In some embodiments, the automatic pixel gain circuit 1100 can operate in either Integrate-While-Read (IWR) mode as a rolling shutter, or in ITR mode as a global-shutter pixel. The timing diagram 1400 illustrates the automatic pixel gain circuit 1100 operating in the ITR mode. The pixel sensor 102 is first reset to clear the variable integration capacitor 504 then integration starts and continues until a SNAP signal goes low. The column analog readout of the automatic pixel gain circuit 1100 output is executed in correlated double sampling (CDS) fashion to reduce reset noise and buffer noise. Since this is an ITR mode, stored signal levels are read first followed by reset levels of the corresponding pixel integration node.

Figure 15:
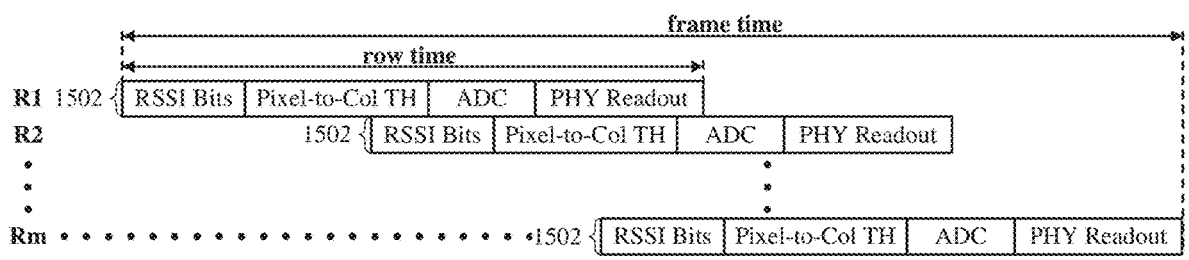
FIG. 15 illustrates a diagram of some embodiments of a structure of a readout data packet for a plurality of rows in a pixel array.

FIG. 15 illustrates a diagram of some embodiments of a structure of a readout data packet 1502 for a plurality of rows R1-$m$ in a pixel array. Each readout data packet 1502 includes the RSSI bits, Pixel-to-Col TH bits, ADC bits, and physical (PHY) Readout bits. In some embodiments, the RSSI bits can be used to adjust per-pixel gain in the AGCA 202 on a column level while each pixel sensor is being sampled into a corresponding column (e.g., see FIGS. 3A-D). In further embodiments, the RSSI bits can be used to adjust per-pixel gain on a pixel level (e.g., see FIGS. 5 and/or 11). In further embodiments, the readout data packet 1502 of each row R1-$m$ in FIG. 3 is sensed globally during the first readout mode and the corresponding RSSI bits may be latched per a pixel in a memory device. In yet further embodiments, the RSSI bits can also be generated in the column as each row of pixels is being read and the RSSI bits can be latched for each pixel or a group of pixels in a region of interested (ROI). Generating the RSSI bits in the column and latching for the group of pixels in the ROI may alleviate per-pixel memory and reduce a number of devices required to implement a readout circuit in a three-dimensional integrated circuit (3DIC). In further embodiments, during the first readout mode, the readout data packets 1502 may be generated before final pixel values for each pixel sensor in the plurality of pixel sensor are generated in a rolling-shutter RSSI mode or a global shutter RSSI mode. Further, the readout data packets 1502 may be read first so they can be used to reconfigure subsequent readout for other ICAS functions.

FIG. 16 illustrates a block diagram of some embodiments of a reconfigurable ADC 1600 utilized in an ROIC architecture configured to set a gain for each pixel sensor in a pixel array according to corresponding RSSI bits.

In some embodiments, a column parallel readout using a reconfigurable ADC 1600 is utilized to process an analog output of the automatic pixel gain circuit 1100 of FIG. 11, an analog output of the AGCA 202 of FIG. 2A or 3A, and/or the analog output of the PGA 118 of FIG. 2B or 5. In such embodiments, the ADC 126 is configured as the reconfigurable ADC 1600. In further embodiments, the reconfigurable ADC 1600 comprises a self-timing logic circuit 1602, capacitor digital-to-analog converters (CDACs) 1604, a comparator 1608, a successive-approximation-register (SAR) logic circuit 1610, and a multiplexer 1612. The CDACs may respectively comprise a plurality of CDAC capacitors 1606. In some embodiments, the reconfigurable ADC 1600 may be configured as a reconfigurable, asynchronous, monotonic switching SAR ADC. Since monotonic switching SAR ADCs are self-initiated by an input sampling event, a successive binary search can be triggered by the completion of later comparisons. The self-timing logic circuit 1602 may be configured as a dual-rail asynchronous logic circuit to detect completion of a bit comparison, thereby enabling the SAR logic circuit 1610 to be self-timed. In some embodiments, the implementation of monotonic switching and asynchronous logic reduces the overall ADC power consumption of the reconfigurable ADC 1600 and enables on-the-fly reconfigurable ADC resolution of the reconfigurable ADC 1600. For example, the ADC resolution of the reconfigurable ADC 1600 may be adjusted according to the RSSI bits of a corresponding pixel sensor. Thus, the reconfigurable ADC 1600 is configured to have a power saving lower ADC resolution mode that may, for example, be selected when the imager noise performance is not limited by quantization noise. Moreover, if less bits are required for lower resolution but higher speed and lower power operation, the sampling period and CDAC capacitive loading of the reconfigurable ADC 1600 can be reduced. In some embodiments, reducing the CDAC capacitive loading of the reconfigurable ADC 1600 may be achieved by disabling a vref buffer (vref3, vref2, or vref1: where vref3=vref2=vref1=vref0=vref) and floating the corresponding CDAC capacitor may, for example, enable: faster sampling, less CDAC switching energy, and less reference buffering power. In such embodiments, this may cause in increase in CDAC KT/C noise power, which can be toleration at lower resolution, N-bit, as along as ADC quantization noise ($q_e$) is the dominant noise ($q_e$=vref/($2^N\sqrt{12}$)).

FIG. 17 illustrates a block diagram of some embodiments of a reconfigurable ADC 1700 according to some alternative embodiments of the reconfigurable ADC 1600 of FIG. 16, wherein the reference buffering power (e.g., vref3, vref2, vref1, and vref0) can be scaled down further with lower resolution if the reference levels for the least significant bit (LSB) capacitors in the plurality of CDAC capacitors 1606 are scaled down. In some embodiments, this may allow the KT/C noise to be optimized for lower buffering power and faster switching speed by reducing the CDAC capacitive loading (KT/C<<vref/($2^N\sqrt{12}$)).

Figure 18:
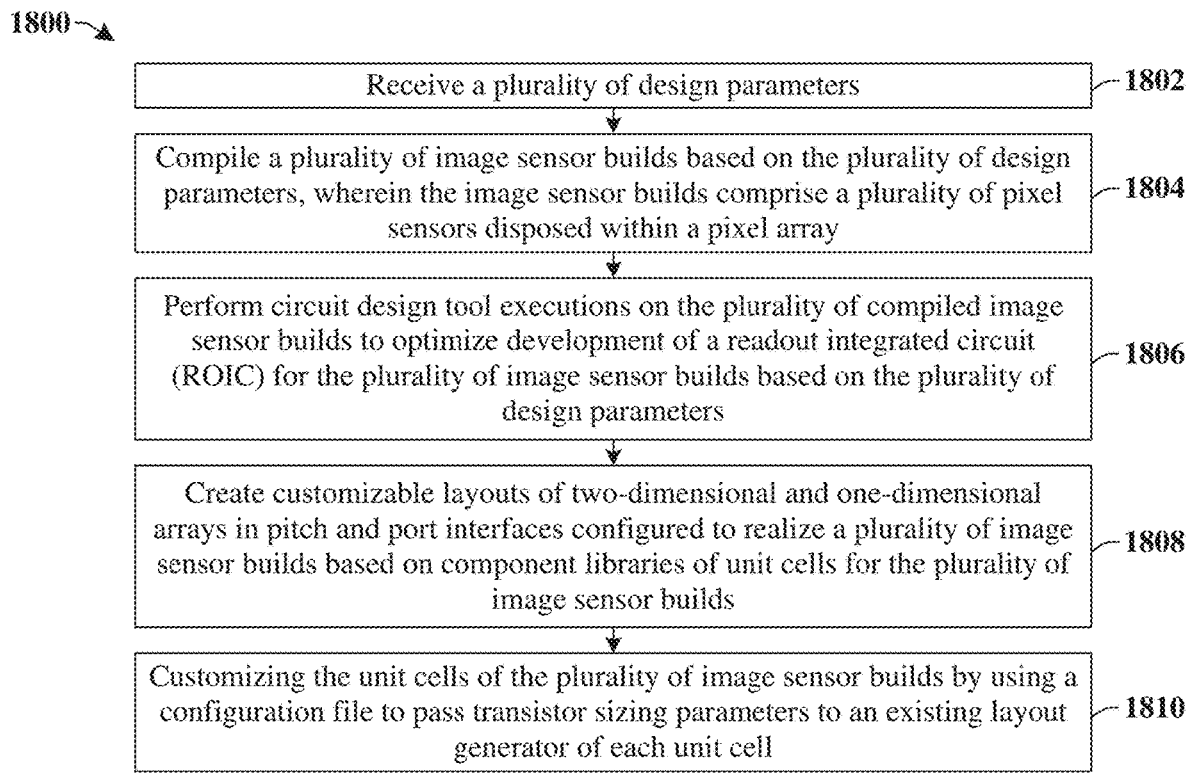
FIG. 18 illustrates a flow diagram of some embodiments of a method for designing a ROIC architecture that is configured to set a gain of a plurality of pixel sensors according to corresponding RSSI bits.

FIG. 18 illustrates a flow diagram of some embodiments of a method 1800 for designing a ROIC architecture for an imager device, where the method is realized and/or implemented in a rapid ROIC development environment. In such embodiments, code from an integrated development environment (IDE) may be stored in a memory device of a computer, a microprocessor, or another suitable component and may be utilized to implement the method 1800.

In some embodiments, ROIC architecture designs are similar to static random access memory (SRAM) where large arrays of identical elements (e.g., pixel sensors in a ROIC vs. bit cells in SRAM) are arrayed and wrapped in interface circuitry. In such embodiments, a layout generator, often referred to as an SRAM compiler, is used to create custom SRAM layouts for different system on a chip (SoC) applications. These compilers operate based on user selection of design parameters such as total SRAM depth, bits per word, aspect ratios, readout speed etc. Similarly, ROIC layouts may be generated through parametrized compilation with user inputs like pixel array size, aspect ratio, framerate, ADC speed, and digital readout bitrate. In some embodiments, for utility, the upper and lower bounds for each design parameter and any interdependency limitations, are constrained to prevent the user from making choices outside what the possible design space specifications.

An ROIC compiler may be used to design the ROIC architecture for the image device, where the ROIC compiler is configured to implement the method 1800. The ROIC compiler allows for customizable parameters to higher image level specifications that allow for full customization of ROIC resolution, dimensions, pixel pitch, full-well capacity, frame rate, dynamic range, sensitivity, etc. In some embodiments, the ROIC compiler makes this possible though use of object orientated programming language to interface with and control readout models and perform circuit design EDA tool executions.

At step 1802, a plurality of design parameters are received. In some embodiments, the plurality of design parameters may be input into a user interface (UI) that is connected to the ROIC compiler. The plurality of design parameters may include default values along with parameter values provided by a user. In some embodiments, the plurality of design parameters include pixel size, pixel array aspect ratio or size, framerate, ADC speed, ADC resolution, digital readout bitrate, the like, or any combination of the foregoing. In some embodiments, the design parameters further include high level image sensor specification inputs, where the high level image sensor specification inputs are configured to provide a customization of ROIC resolution, dimensions, pixel pitch, full-well capacity, frame rate, dynamic range, sensitivity, the like, or any combination of the foregoing.

At step 1804, a plurality of image sensor builds are compiled based on the plurality of design parameters, where the image sensor builds comprise a plurality of pixel sensors disposed within a pixel array. In some embodiments, the image sensor builds comprise pixel sensors, amplifiers, ADCs, line-memory, readout buffers, input/output (IO) pad frame, the like, or any combination of the foregoing.

At step 1806, circuit design tool executions are performed on the plurality of compiled image sensor builds to optimize development of a ROIC architecture for the plurality of image sensor builds based on the plurality of design parameters.

At step 1808, customizable layouts of two-dimensional and one-dimensional arrays are created in pitch and port interfaces that are configured to realize a plurality of image sensors builds based on component libraries of unit cells for the plurality of image sensor builds.

At step 1810, the unit cells of the plurality of image sensor builds are customized by using a configuration file to pass transistor sizing parameters to an existing layout generator of each unit cell.

In some embodiments, the ROIC compiler addresses design considerations spanning sensitivity, noise, dynamic range, ADC resolution, AGCA bit depth, and power savings. Since the RSSI bits and the column ADC output bits are combined to form the complete output digital number, the ADC bit resolution is relaxed leading to dramatic power and area savings. The ROIC compiler can optimize the design space for ADC specifications versus power consumption. To quantify the ADC power consumption (P) relative to its resolution, effective number of bits (ENOB), at a calculated speed of operation, sampling rate ($f_s$), let's consider the two universally accepted ADC figure of merits (FoM), Walden's ($FoM_W$), and Schreier's ($FoM_S$). Both FoMs agree that power is directly proportional with $f_s$.

ADC resolution power scaling occurs at different rates depending on underlying circuit limitations such as thermal noise or the process technology itself. In advanced process nodes (e.g., less than 90 nm), circuits may be limited by thermal noise and therefore power scales by a factor of four for every added bit. Walden's FOM uses the technology limits while Schreier's uses the thermal limits. Typically, Schreier's FOM is expressed in dB but for consistency both FOM equations are shown as linear expressions below:

$$FOM_W = \frac{P}{f_s \cdot 2^{ENOB}} \text{(joules/conversion step)}$$

$$FOM_S = \frac{P}{f_s \cdot 4^{ENOB}} \text{(joules/conversion step)}$$

In some embodiments, if the ADC sampling rate remains unchanged and the ADC resolution is reduced from 12-bits to 8-bits, the total ADC power will be reduced by 16× to 256× depending on the process node.

The ROIC architecture may use a wide variety of ADCs which typically include architectures like pipeline, successive approximation register (SAR), single or multiple slope, sigma-delta ADCs, the like, or any combination of the foregoing. The ADC choice is made based on the imaging architecture. In some embodiments, the imaging architecture determines what ADC type is most power efficient for a given layout, column pitch, global placement, etc. The architecture decision is made in conjunction with the ADC ENOB and $f_s$ for a given ROIC row time allocation. In some embodiments, the ROIC compiler may automate the calculation of which ADC to use and suggest the most suitable ADC ENOB and $f_s$ versus RSSI bits for the desired ROIC power, sensitivity, and dynamic range.

Figure 19:
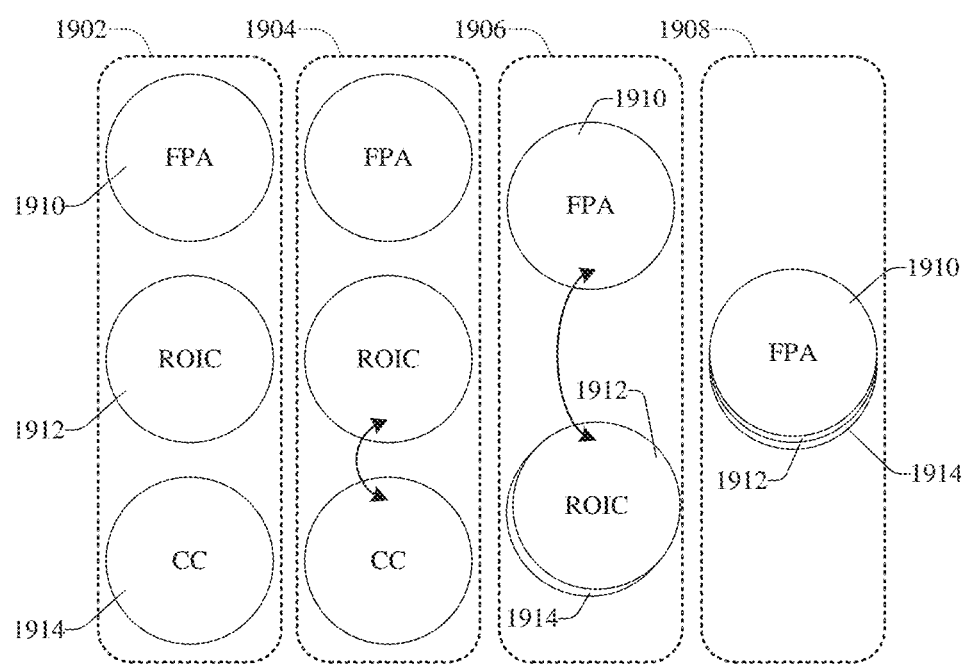
FIG. 19 illustrates a block diagram of some embodiments of a method for fabricating a ROIC architecture and a plurality of pixel sensors in a three-dimensional integrated circuit (3DIC).

FIG. 19 illustrates a block diagram of some embodiments of a method for fabricating a ROIC architecture and a plurality of pixel sensors in a three-dimensional integrated circuit (3DIC).

At step 1902 a focal plane array (FPA) wafer 1910, a ROIC wafer 1912, and a capacitor and coprocessor (CC) wafer 1914 are provided. In some embodiments, the FPA wafer 1910 may include a plurality of pixel sensors (e.g., comprising a plurality of photodiodes), a plurality of microlenses, the like, or any combination of the foregoing, where the plurality of pixel sensors are configured as visible light pixels or infrared (IR) pixels. In further embodiments, the ROIC wafer 1912 may, for example, be or comprise a plurality of pixel devices (e.g., transistors, ADCs, amplifiers, etc.) configured as a ROIC architecture that may output a digital signal from a pixel signal of each pixel sensor. The ROIC wafer 1912 may include the readout components from the circuits 200-500 and 1100 of FIGS. 2-5 and 11-12. In yet further embodiments, the CC wafer 1914 may comprise a plurality of electronic devices including capacitors, transistors, microprocessors, etc.

At step 1904, the ROIC wafer 1912 is bonded to the CC wafer 1914, where the devices on the ROIC wafer 1912 may be electrically coupled to the CC wafer 1914 by one or more interconnect structures and/or a plurality of through silicon vias (TSVs). At step 1906, the FPA wafer 1910 is bonded to the ROIC wafer 1912 thereby forming a 3DIC. Step 1908 illustrates the 3DIC comprising the FPA wafer 1910, the ROIC wafer 1912, and the CC wafer 1914 respectively bonded to one another.

Figure 20:
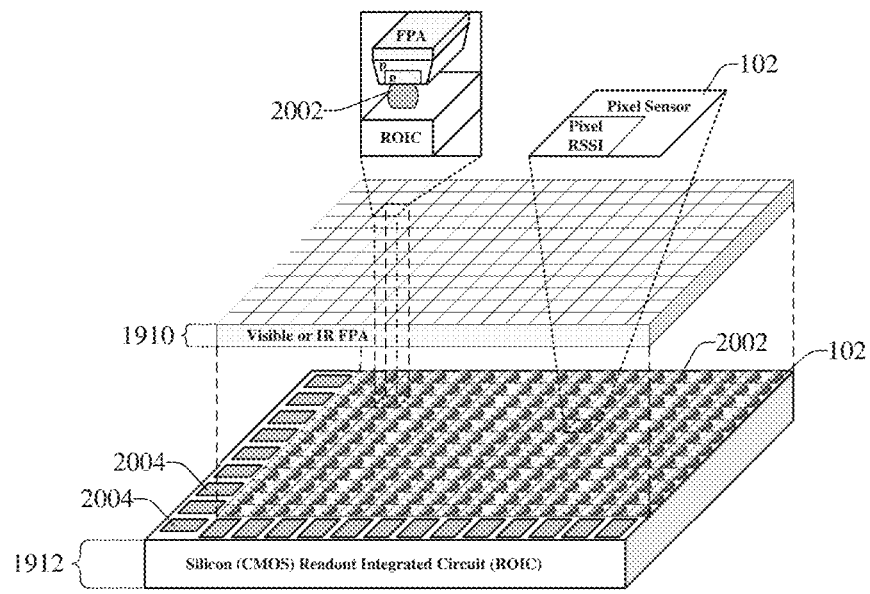
FIG. 20 illustrates a perspective view of some embodiments of a focal plane array (FPA) wafer being bonded to a ROIC wafer.

FIG. 20 illustrates a perspective view 2000 of some embodiments of the FPA wafer 1910 being bonded to the ROIC wafer 1912. As illustrated in FIG. 20, the ROIC wafer 1912 includes a plurality of pixel sensors 102 disposed within a central region of the ROIC wafer 1912 and a plurality of input/output (I/O) pads 2004 disposed within a peripheral region of the ROIC wafer 1912. Further, a plurality of solder bumps 2002 directly overly each pixel sensor 102. In some embodiments, components/devices on the ROIC wafer 1912 may be electrically coupled to components/devices on the FPA wafer 1910 by way of the solder bumps 2002 and a plurality of TSVs (not shown).

Figure 21:
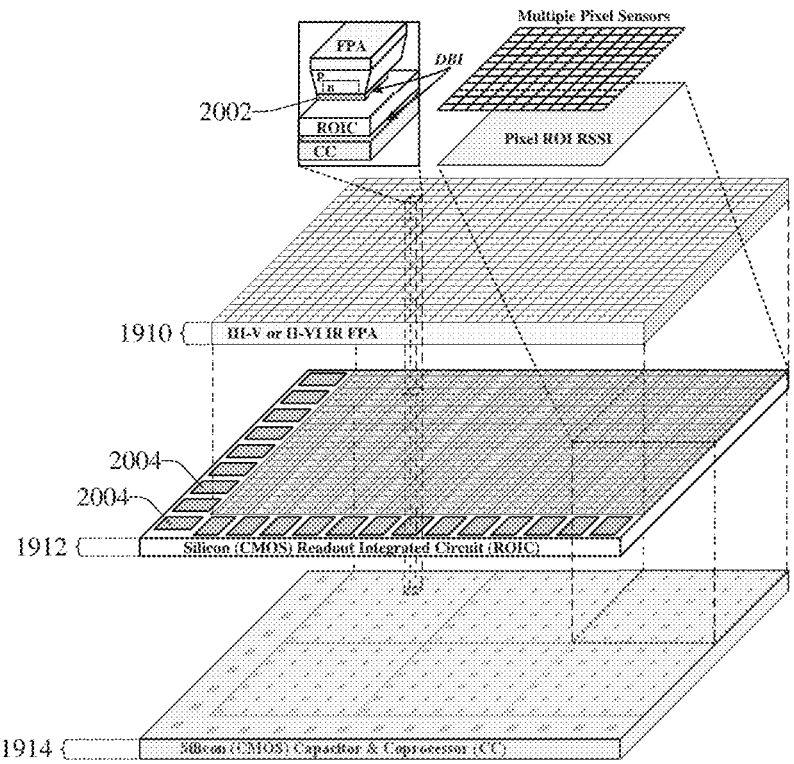
FIG. 21 illustrates a perspective view of some embodiments of the 3DIC of FIG. 19.

FIG. 21 illustrates a perspective view 2100 of some embodiments of the 3DIC of FIG. 19. In some embodiments, a subset of the plurality of pixel sensors 102 are disposed in a region of interest (ROI) of the ROIC wafer 1912. In some embodiments, the readout devices of the circuits 200-500 and 1100 of FIGS. 2-5 and 11-12 may be configured to determine a per-ROI gain value for the pixel sensors in the ROI in the 3D approach (e.g., small pixels) or in a per-pixel memory in a two-dimensional (2D) approach (e.g., large pixels) based on the RSSI bits as illustrated and/or described in FIGS. 2-5 and 11-12. In some embodiments, whether the gain is determined per-pixel or per-ROI of pixel sensors, both may be implemented in a column based readout circuit using RSSI bits.

In some embodiments, an HDR ROIC chip including the readout devices of FIG. 2-5 or 11-12 may be implemented in a 3DIC as illustrated and/or described in FIGS. 19-21. In further embodiments, the HDR ROIC chip will be designed to interface with a small format long or mid wave infrared (LWIR/MWIR) array detector. In further embodiments, The HDR ROIC chip may be designed and/or optimized by the ROIC compiler.

Accordingly, in some embodiments, the present application provides an imager device including a pixel sensor configured to receive and convert incident radiation into a signal; and a look ahead front-end analog sensing readout circuit configured to receive the signal from the pixel sensor and output a digital signal based on a received signal strength indicator (RSSI) of the signal from the pixel sensor. In an embodiment, the look ahead front-end analog sensing readout circuit includes an RSSI circuit that includes a conversion element (e.g., a capacitor) configured to convert the input pixel photocurrent into an analog voltage; and a readout back-end to digitize the unsettled analog voltage into signal level range information as coarse digital bits and use these coarse digital bits to digitally reconfigure subsequent analog and digital readout operations. In an embodiment, the coarse digital bits are the desired per-pixel RSSI bits and can be produced by an in-pixel device (e.g., a circuit placed in each pixel) or an in-column device (e.g., a circuit placed on a single column or multiple columns pitch) during an operating mode called a first readout mode. In an embodiment, the in-pixel device includes an amplifier circuit containing a variable integration capacitor and configured to output an analog signal; a memory circuit coupled to the variable integration capacitor and configured to provide the RSSI directly to the variable integration capacitor during the first readout mode; wherein the variable integration capacitor adjusts a gain of the signal from the pixel sensor based on the RSSI received from the memory circuit; and the in-pixel analog output is converted by an analog-to-digital converter (ADC) to a digital output using in-column ADC circuitry or a global ADC (e.g., by a circuit placed independent of a single column or multiple columns pitch). In an embodiment, the in-column device includes an amplifier circuit comprising a variable integration capacitor and configured to output an analog signal; a memory circuit coupled to the variable integration capacitor and configured to provide the RSSI directly to the variable integration capacitor during the first readout mode; wherein the variable integration capacitor adjusts the gain of the signal from the pixel sensor based on the RSSI received from the memory circuit; and the in-pixel analog output is converted by an analog-to-digital converter (ADC) to a digital output using in-column ADC circuitry or a global ADC (e.g., by a circuit placed independent of a single column or multiple columns pitch).

In an embodiment, a plurality of image sensor pixels have mixed-signal outputs. A plurality of image sensor pixels of this type form a mixed-signal ROIC (MROIC). First a digital output and second an analog output. The digital output is based on the unsettled analog input acquired during the first readout mode. The analog output is the final settled pixel value acquired at the end of the integration time or charge transfer. The settled analog output can be digitized later in-pixel, in-column, or globally.

In a further embodiment, wherein the ADC a reconfigurable resolution which can be decided based on the RSSI bits from the first readout mode or independently as a user programmable option. In an embodiment, a monotonic switching SAR ADC architecture is used to trigger the first comparison generating the ADC MSB first once the input signal is sampled. This self-initiated binary search of the successive approximation logic asynchronously generates the remaining ADC bits. Once a bit comparison completion is detected with the desired ADC bit depth, the ADC digital output is latched allowing for on-the-fly reconfigurable ADC resolution. In an embodiment, the incident radiation can be any radiation in the visible or nonvisible electromagnetic spectrum (e.g., infrared radiation).

In further embodiments, the present application provides an imager device including a plurality of pixel sensors respectively configured to receive and convert incident radiation into respective signals; and a readout circuit configured to receive the respective signals and determine a pixel gain setting for each pixel sensor based on a received signal strength indicator (RSSI) of each respective signal through circuitry options such as the in-pixel device or the in-column device. In an embodiment, the RSSI of each pixel sensor not only enables per-pixel gain setting but are also latched in the RSSI device and can be read independently as a coarse image representative of the a plurality of pixel sensors array in the imager device. In further embodiments, the coarse image can be read independently through column and row decoders in an m×n addressable pixel array. The row and column addresses can be sequentially toggled until the entire coarse image is read or the column and row decoders can be programmed to read the digital image in any order suitable for a given compression algorithm. In an embodiment, the RSSI of each pixel sensor enables intelligent context adaptive sensing (ICAS) functions in downstream processing. In another embodiment, the ICAS functions include using adjustable frame-by-frame functions, region of interest windowing, ADC resolution selection, input-output (IO) port selection and event-driven low-power imaging. In an embodiment, the design of the readout circuitry can be segmented in a 3D wafer integration stack to enable smaller pixel size pitch with added RSSI functionality. The second wafer will be used to enable programmable in-pixel gain capacitor selection and additional digital processing resources for ICAS functions.

Accordingly, in some embodiments, the present application provides a scalable method of designing a read out integrated circuit ROIC for the imager device, the scalable method includes receiving a plurality of parameters; electronically compiling a plurality of image sensor builds based on the plurality of parameters, the image sensor builds including pixels, amplifiers, ADCs, line-memory, readout buffers, and IO pad frame; and providing characteristics for the plurality of image sensor builds. In an embodiment, the scalable method is termed a ROIC compiler, wherein the design of the readout circuitry can be automated to enable rapid ROIC development. The ROIC compiler is a ROIC layout generator which uses a parametrized compilation of user inputs including pixel size, pixel array aspect ratio or size, framerate, ADC speed, and digital readout bitrate. In an embodiment, the ROIC compiler utilizes an object oriented programming language to interface with the mathematical readout models and perform circuit design tool executions. In another embodiment, the ROIC compiler is configured to accept high level image sensor specification inputs allowing for the full customization of ROIC resolution, dimensions, pixel pitch, full-well capacity, frame rate, dynamic range, sensitivity, etc. In some embodiments, the ROIC compiler is configured to output customizable layouts of two-dimensional and one-dimensional arrays in pitch and port interfaces necessary to realize a plurality of image sensor builds based on component libraries of unit cells for said image sensor builds. In an embodiment, The ROIC compiler is configured to customize the unit cells of the image sensor builds libraries using a configuration file to pass the transistor sizing parameters to the existing layout generator of each unit cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An imager device, comprising:
a pixel sensor configured to receive and convert incident radiation into a pixel signal; and
a readout circuit configured to receive the pixel signal from the pixel sensor, generate a received signal strength indicator (RSSI) value based on the pixel signal, and generate a digital signal based on the RSSI value and the pixel signal, wherein the readout circuit comprises:
a conversion element configured to convert the pixel signal into an analog voltage, wherein the pixel signal is a photocurrent from the pixel sensor; and
a RSSI circuit configured to convert the analog voltage into RSSI bits, wherein the readout circuit is configured to reconfigure downstream readout operations according to the RSSI bits.

2. The imager device of claim 1, wherein the RSSI bits comprise the RSSI value, and wherein the RSSI circuit is configured as an in-pixel device or an in-column device that first generates the RSSI bits at a beginning of an integration time.

3. The imager device of claim 1, wherein the readout circuit comprises:
an amplifier circuit comprising a variable integration capacitor, wherein the amplifier circuit is configured to output an analog signal based on the pixel signal and a gain of the amplifier circuit; and
a memory circuit coupled to the variable integration capacitor and configured to provide the RSSI bits directly to the variable integration capacitor;
wherein the variable integration capacitor adjusts the gain of the amplifier circuit based on the RSSI bits received from the memory circuit, wherein the analog signal is converted by an analog-to-digital converter (ADC) to the digital signal.

4. The imager device of claim 3, wherein the analog signal converted into the RSSI bits is an in-column analog signal.

5. The imager device of claim 3, wherein the analog signal converted into the RSSI bits is an in-pixel analog signal.

6. The imager device of claim 3, further comprising:
a plurality of pixel sensors respectively configured to receive and convert the incident radiation into respective signals, wherein the plurality of pixel sensors includes the pixel sensor;

wherein the readout circuit is configured to receive the respective signals and determine per-pixel gain settings configured to set the gain of the amplifier circuit, wherein the per-pixel gain settings correspond to the respective signals based on a RSSI value of each respective signal through the RSSI circuit.

7. The imager device of claim 6, wherein the RSSI value of each pixel sensor respectively enables per-pixel gain setting and is latched in the memory circuit, wherein the RSSI values are configured to represent a coarse image representative of the incident radiation at the plurality of pixel sensors.

8. The imager device of claim 7, wherein the coarse image is read through column and row decoders in an addressable pixel array, wherein column and row addresses associated with the column and row decoders are sequentially or randomly toggled until the coarse image is fully or partially read, or the column and row decoders read the coarse image in an order suitable for a given compression algorithm.

9. The imager device of claim 6, wherein the RSSI value of each pixel sensor enables intelligent context adaptive sensing (ICAS) functions in downstream processing.

10. The imager device of claim 9, wherein the ICAS functions comprise adjustable frame-by-frame functions, region of interest (ROI) windowing, ADC resolution selection, input-output (10) port selection, and event-driven low-power imaging.

11. The imager device of claim 9, wherein a design of the readout circuit can be segmented in a three-dimensional (3D) wafer integration stack including a first wafer and a second wafer bonded to the first wafer, wherein the second wafer is configured to provide programmable in-pixel gain capacitor selection and additional digital processing or memory resources for ICAS functions.

12. The imager device of claim 1, further comprising:
a plurality of pixel sensors, wherein the plurality of pixel sensors includes the pixel sensor, wherein the plurality of pixel sensors respectively have mixed-signal outputs, wherein the plurality of pixel sensors form a mixed-signal read out integrated circuit (MROIC), wherein the mixed-signal outputs respectively have a first digital output and a second analog output, wherein the first digital output is based on an unsettled analog input, wherein the second analog output is a final settled pixel value acquired at an end of an integration time or a charge transfer, wherein the second analog output is digitized in an analog-to-digital converter (ADC).

13. The imager device of claim 12, wherein the ADC has a reconfigurable resolution, a reconfigurable sampling rate, and reconfigurable power consumption which can be configured based on the RSSI bits.

14. The imager device of claim 13, wherein the ADC has a monotonic switching successive approximation register (SAR) ADC architecture that is used to trigger a first comparison generating an ADC most significant bit (MSB) when an input signal is sampled, wherein a self-initiated binary search of successive approximation logic asynchronously generates remaining ADC bits, wherein the reconfigurable resolution is latched after a bit comparison completion based on a dedicated sampling time, wherein a programmable sampling pulse width and the reconfigurable sampling rate allow for the reconfigurable resolution.

15. The imager device of claim 1, wherein the incident radiation is infrared radiation, visible wavelength radiation, or non-visible wavelength radiation.

16. An imager device, comprising:
a mixed-signal read out integrated circuit (MROIC) comprising a plurality of pixel sensors, wherein the plurality of pixel sensors include a first pixel sensor configured to receive and convert incident radiation into a pixel signal, wherein the plurality of pixel sensors respectively have mixed-signal outputs, wherein the mixed-signal outputs respectively have a first digital output and a second analog output, wherein the first digital output is based on an unsettled analog input, wherein the second analog output is a final settled pixel value acquired at an end of an integration time or a charge transfer, wherein the second analog output is digitized in an analog-to-digital converter (ADC); and
a readout circuit configured to receive the pixel signal from the first pixel sensor, generate a received signal strength indicator (RSSI) value based on the pixel signal, and generate a digital signal based on the RSSI value and the pixel signal.

17. The imager device of claim 16, wherein the ADC has a reconfigurable resolution, a reconfigurable sampling rate, and reconfigurable power consumption which can be configured based on the RSSI value.

18. The imager device of claim 17, wherein the ADC has a monotonic switching successive approximation register (SAR) ADC architecture that is used to trigger a first comparison generating an ADC most significant bit (MSB) when an input signal is sampled, wherein a self-initiated binary search of successive approximation logic asynchronously generates remaining ADC bits, wherein the reconfigurable resolution is latched after a bit comparison completion based on a dedicated sampling time, wherein a programmable sampling pulse width and the reconfigurable sampling rate allow for the reconfigurable resolution.

19. An imager device, comprising:
a pixel sensor configured to receive and convert incident radiation into a pixel signal;
a readout circuit configured to receive the pixel signal from the pixel sensor, generate a received signal strength indicator (RSSI) value based on the pixel signal, and generate a digital signal based on the RSSI value and the pixel signal, wherein the readout circuit comprises:
an amplifier circuit comprising a variable integration capacitor, wherein the amplifier circuit is configured to output an analog signal based on the pixel signal and a gain of the amplifier circuit; and
a memory circuit coupled to the variable integration capacitor and configured to provide the RSSI value directly to the variable integration capacitor;
wherein the variable integration capacitor adjusts the gain of the amplifier circuit based on the RSSI value received from the memory circuit.

20. The imager device of claim 19, wherein the analog signal is converted by an analog-to-digital converter (ADC) to the digital signal using in-column ADC circuitry or a global ADC.

* * * * *